United States Patent
Ortner et al.

(10) Patent No.: US 9,034,233 B2
(45) Date of Patent: May 19, 2015

(54) METHOD OF PROCESSING A SUBSTRATE

(75) Inventors: Joerg Ortner, Drobollach (AT); Michael Sorger, Villach (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 504 days.

(21) Appl. No.: 12/955,959

(22) Filed: Nov. 30, 2010

(65) Prior Publication Data

US 2012/0133084 A1 May 31, 2012

(51) Int. Cl.
| | |
|---|---|
| B28B 7/22 | (2006.01) |
| B28B 11/08 | (2006.01) |
| B22D 19/00 | (2006.01) |
| H01L 21/02 | (2006.01) |
| H05K 1/02 | (2006.01) |
| H01L 21/768 | (2006.01) |
| H01L 21/311 | (2006.01) |
| H01L 21/48 | (2006.01) |
| H01L 23/00 | (2006.01) |
| G03F 7/00 | (2006.01) |

(52) U.S. Cl.
CPC ............ *B22D 19/0072* (2013.01); *H01L 21/02* (2013.01); *H05K 1/02* (2013.01); *H01L 21/76898* (2013.01); *H01L 21/311* (2013.01); *H01L 21/486* (2013.01); *H01L 24/05* (2013.01); *G03F 7/0002* (2013.01); *H05K 2201/09036* (2013.01); *H05K 2203/0108* (2013.01); *H05K 2203/308* (2013.01); *Y10S 977/887* (2013.01)

(58) Field of Classification Search
USPC .................. 264/255, 293, 294, 296, 250, 241; 977/877
See application file for complete search history.

(56) References Cited

U.S. PATENT DOCUMENTS

| | | | |
|---|---|---|---|
| 3,534,440 A * | 10/1970 | Roberts .......................... | 425/195 |
| 4,110,139 A * | 8/1978 | Mashida et al. ................ | 156/79 |
| 5,089,358 A | 2/1992 | Taki et al. | |
| 5,324,473 A | 6/1994 | Baresich | |
| 5,897,814 A | 4/1999 | Niemeyer et al. | |
| 6,143,226 A | 11/2000 | Fujimoto et al. | |
| 6,190,585 B1 | 2/2001 | Brown et al. | |
| 6,325,950 B1 | 12/2001 | Hosokawa et al. | |
| 6,753,947 B2 | 6/2004 | Meisburger et al. | |
| 6,780,001 B2 * | 8/2004 | Eldridge et al. .............. | 425/385 |
| 6,780,362 B1 | 8/2004 | Story et al. | |
| 8,293,641 B2 | 10/2012 | Seidel et al. | |
| 2002/0025443 A1 | 2/2002 | Ohno | |
| 2004/0008334 A1* | 1/2004 | Sreenivasan et al. .......... | 355/72 |
| 2004/0227270 A1 | 11/2004 | Takebe et al. | |

(Continued)

FOREIGN PATENT DOCUMENTS

| | | | | |
|---|---|---|---|---|
| DE | 102006030267 A1 | 1/2008 | | |
| WO | 2006116865 A1 | 11/2006 | | |
| WO | 2007030527 A2 | 3/2007 | | |
| WO | WO 2009147381 | * 12/2009 | .............. | H01L 51/52 |

OTHER PUBLICATIONS

Chou—Appl. Phys. Lett., vol. 67, Issue 21, pp. 3114-3116 (1995) by Stephan Y. Chou et al.*

(Continued)

*Primary Examiner* — Jeremiah Smith

(57) ABSTRACT

In a method of processing a substrate in accordance with an embodiment, a trench may be formed in the substrate, imprint material may be deposited at least into the trench, the imprint material in the trench may be embossed using a stamp device, and the stamp device may be removed from the trench.

25 Claims, 11 Drawing Sheets

(56) References Cited

U.S. PATENT DOCUMENTS

| | | |
|---|---|---|
| 2005/0170639 A1 | 8/2005 | Mei |
| 2005/0259549 A1 | 11/2005 | Yokoi |
| 2005/0277561 A1 | 12/2005 | Hendrickx et al. |
| 2006/0065992 A1 | 3/2006 | Hutchinson et al. |
| 2006/0279025 A1* | 12/2006 | Heidari et al. ............... 264/496 |
| 2007/0278712 A1* | 12/2007 | Okushima et al. ............ 264/236 |
| 2009/0029191 A1* | 1/2009 | Albrecht ...................... 428/848 |
| 2009/0153762 A1* | 6/2009 | Kuwabara et al. ............. 349/43 |
| 2009/0207723 A1 | 8/2009 | Ito |
| 2011/0163340 A1* | 7/2011 | Smith ............................ 257/98 |

OTHER PUBLICATIONS

Stephen Y. Chou et al., "Nanoimprint lithography", 1996, American Vaccum Society, J. Vac. Sci. Technol. B 14(6), Nov./Dec. 1996, pp. 4129-4133.

Jonathan Edwards: "3D nanoprinter makes oxide sculptures", http.//chem8.org/bbs/viewthread.php?action=printable&tid=9768, pp. 1-2.

"Co-operative Research projects for SMEs" vol. 2, European Commission 2006, pp. 1-64.

Marko Vogler et al. "Development of a novel, low-viscosity UV-curable polymer system for UV-nanoimprint lithography", P-NIL 31—Nanoimprint Lithography, MNE'06 Micro- and Nano-Engineering, pp. 1-2.

Marc Verschuuren et al., Photonic Structures by Sol-Gel Imprint Lithography, "Materials Research Society 3D", 1995-2010; http://www.mrs.org/s_mrs/sec_subscribe.asp?CID=8775&DID=201953&action=detail&css=print.

Non-final Office Action issued in the corresponding U.S. Appl. No. 14/247,274 dated Jun. 13, 2014.

Final Office Action received for corresponding U.S. Appl. No. 14/247,274, dated Sep. 17, 2014, 21 pages.

Non-Final Office Action in the corresponding U.S. Appl. No. 14/247,282, dated Oct. 22, 2014, 14 pages.

* cited by examiner

US 9,034,233 B2

METHOD OF PROCESSING A SUBSTRATE

TECHNICAL FIELD

Embodiments generally relate to a method of processing a substrate.

BACKGROUND

In semiconductor processing it may be desirable to realize three-dimensional (3D) structures. Approaches to realize 3D structures include, for example, lithographic processes. However, creating 3D structures by means of lithographic processes may be toilsome (for example, a high number of process steps may be required) and/or costly (for example, due to use of two-photon absorption processes, expensive tools). Standard processes (e.g. standard microlithography processes or nanoimprint processes) may define only two-dimensional (lateral) structures.

BRIEF DESCRIPTION OF THE DRAWINGS

In the drawings, like reference characters generally refer to the same parts throughout the different views. The drawings are not necessarily to scale, emphasis instead generally being placed upon illustrating the principles of embodiments. In the following description, various embodiments are described with reference to the following drawings, in which.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

The term "layer" or "layer structure" as used herein may be understood to refer to a single layer, or to a layer sequence (also referred to as layer stack) including a plurality of sublayers. In a layer sequence or layer stack the individual sublayers may, for example, include or may be made of different materials, or at least one of the sublayers may include or may be made of the same material as another one of the sublayers.

The terms "disposed on", "arranged on" or "formed on" as used herein may be understood to refer to a layer (or some other element or entity) that may be located in direct mechanical and/or electrical contact on another layer (element or entity). A layer (element or entity) may also be located in indirect (mechanical and/or electrical) contact with another layer (element or entity), in this case one or more additional layers (elements or entities) may be present in-between.

The terms "disposed over", "arranged over" or "formed over" as used herein may be understood to refer to a layer (or some other element or entity) that may be located at least indirectly on another layer (element or entity). That is, one or more other layers (elements or entities) may be located between the given layers (elements or entities).

The terms "electrically connected", "electrically contacted" or "electrically coupled" may be understood to include both a direct electrical connection, contact or coupling and an indirect electrical connection, contact or coupling.

Figure 1:
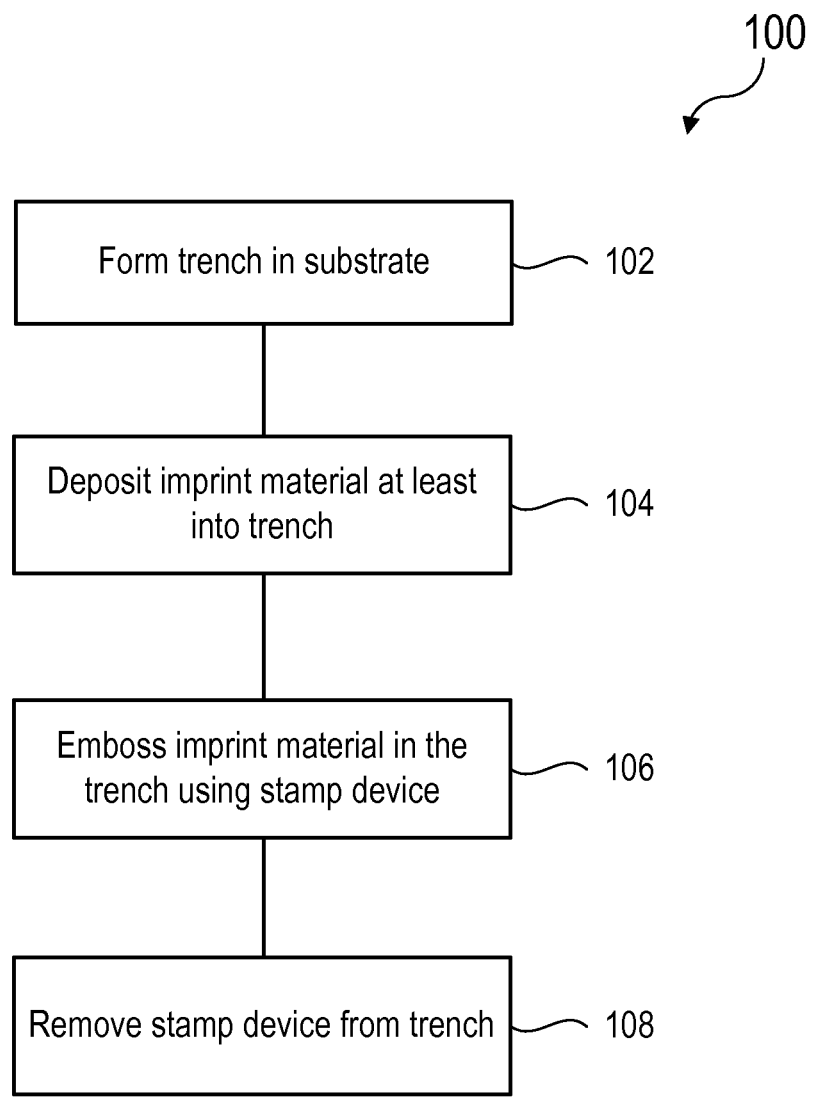
FIG. 1 is a diagram illustrating a method of processing a substrate in accordance with an embodiment.

FIG. 1 is a diagram illustrating a method 100 of processing a substrate in accordance with an embodiment.

In accordance with an embodiment, the substrate may be a semiconductor substrate, in other words a substrate that may include or may be made of one or more semiconducting materials. For example, the substrate may include or may be made of silicon (Si), alternatively any other suitable semiconductor material such as e.g. germanium (Ge), a IV-IV compound semiconductor (e.g. SiGe), a III-V compound semiconductor (e.g. GaAs), a II-VI compound semiconductor (e.g. CdTe), or any other suitable semiconductor material.

In accordance with an embodiment, the substrate may be or may include a wafer, or may be part of a wafer, for example a semiconductor wafer such as for example a silicon wafer, alternatively any other suitable semiconductor wafer.

In accordance with another embodiment, the substrate may be or may include a printed circuit board (PCB).

In 102, a trench may be formed in the substrate.

In accordance with an embodiment, forming the trench may include an etch process. In other words, the trench may be formed using an etch process, for example a standard trench etch process. In accordance with another embodiment, forming the trench may include a cutting process. In other words, the trench may be formed using a cutting process. In accordance with other embodiments, forming the trench may be achieved by means of other suitable processes.

In accordance with an embodiment, a barrier layer may be deposited. The barrier layer may be deposited before depositing imprint material into the trench (see below). In accordance with an embodiment, the barrier layer may be deposited over a sidewall or sidewalls of the trench. The barrier layer may be deposited using any suitable layer deposition method.

In accordance with an embodiment, a seed layer may be deposited. The seed layer may be deposited before depositing imprint material into the trench (see below). In accordance with an embodiment, the seed layer may be deposited over a sidewall or sidewalls of the trench. In accordance with an embodiment, the seed layer may be deposited over at least a part of the barrier layer (if provided). The seed layer may be deposited using any suitable layer deposition method.

In 104, imprint material may be deposited at least into the trench.

The term "imprint material" as used herein may be understood to include materials that may be patterned or structured by means of embossing or imprinting, for example materials that may be patterned or structured using a stamp device (such as, for example, a stamp or imprint stamp, or a roll) having an imprint structure or pattern (e.g. a micro-imprint structure or nano-imprint structure).

In accordance with an embodiment, the imprint material may be deposited such that the trench is partially filled with the imprint material. In accordance with another embodiment, the imprint material may be deposited such that the trench is completely filled with the imprint material.

In accordance with an embodiment, the imprint material may include or may be a hardenable material.

The term "hardenable material" as used herein may be understood to include materials that may change or may be transformed from a first state of lower hardness or resistivity (also referred to as non-hardened state) to a second state of, compared to the first state, higher hardness or resistivity (also referred to as hardened state). The changeover from the first (non-hardened) state to the second (hardened) state may also be referred to as "hardening" or "toughening".

In accordance with some embodiments, in case that the imprint material includes or is a hardenable material, the imprint material may be deposited while it is in the non-hardened state.

In accordance with an embodiment, the hardenable material may include or may be a polymeric or polymerizable material, for example a polymeric resist material in accordance with an embodiment, e.g. a photosensitive resist material (or photo resist) in accordance with an embodiment, e.g. an UV (ultraviolet) sensitive photo resist in accordance with an embodiment, or a thermosensitive resist material in accordance with another embodiment.

In case that a polymeric or polymerizable material (for example polymeric resist material, e.g. photo resist) is used as hardenable material, hardening may illustratively be accomplished by cross-linking of polymer chains of the polymeric or polymerizable material (for example polymeric resist material, e.g. photo resist). In this connection, hardening the polymeric or polymerizable material may also be referred to as curing and the hardenable material may also be referred to as curable material.

In accordance with some embodiments, the hardenable material may be configured such that cross-linking of the polymer chains may be achieved by means of light illumination or irradiation (in case of a photosensitive resist material), for example by means of UV irradiation (e.g. in case of an UV sensitive resist material), in other words by exposing the material to light (e.g. UV light), and may, for example, lead to a change in the solubility of the polymeric or polymerizable material (for example polymeric resist material, e.g. photo resist).

In accordance with another embodiment, the hardenable material may be configured such that cross-linking of the polymer chains may be achieved by means of applying elevated temperatures (e.g. tempering or anneal process). For example, hardenable materials that may be hardened by means of elevated temperatures may include thermosetting materials.

In accordance with still another embodiment, the hardenable material may be configured such that hardening or curing (e.g. cross-linking) of the hardenable material may be achieved by applying an electrical voltage to the hardenable material.

In accordance with still another embodiment, the hardenable material may be configured as a self-hardening material, in other words as a material that may harden without external influence (e.g. without applying irradiation, elevated temperatures or electrical voltages), for example just after expiry of a certain amount of time.

In accordance with another embodiment, the imprint material may include or may be a mold compound.

In accordance with another embodiment, the imprint material may include or may be a nanopaste material.

The imprint material may be deposited using any suitable deposition method. For example, in accordance with some embodiments, in case that the imprint material includes or is an imprint resist, the imprint material may be deposited using any suitable resist deposition method such as, for example, a spin-coating method in accordance with an embodiment. In accordance with other embodiments, other suitable deposition methods may be used.

In accordance with some embodiments, depositing the imprint material may further include depositing the imprint material over at least a part of the substrate surface, for example at least over a part or parts of the substrate surface that are proximate or adjacent the trench in accordance with an embodiment. The imprint material may, for example, cover the substrate surface.

In accordance with one embodiment, depositing the imprint material may include coating the substrate (e.g. wafer) with a layer (e.g. thick layer) of imprint material (e.g. imprint resist).

In 106, the imprint material may be embossed using a stamp device.

The term "stamp device" as used herein may be understood to include devices, for example stamps, that may be used for embossing or imprinting an imprint material, thereby patterning or structuring the imprint material. In accordance with some embodiments, the stamp device may, for example, include or may be a stamp. In this case the stamp may also be referred to as imprint stamp. In accordance with other embodiments, the stamp device may, for example, include or may be a structured roll.

In case that the imprint material includes or is a hardenable material, the imprint material may be embossed while it is still in the non-hardened state.

In accordance with some embodiments, the stamp device (e.g. stamp) may include at least one imprint pattern or structure that may be suitable for embossing structures in the trench. For example, in accordance with an embodiment, the stamp device (e.g. stamp) may include one or more micro-imprint structures. The term "micro-imprint structure" as used herein may be understood to include imprint structures or patterns, one or more spatial dimensions (i.e. length, width, height) of which are in the micrometer range (for example, on the order of magnitude of a few micrometers, of a few tens of a micrometer, or of a few hundreds of a micrometer). In other words, a "micro-imprint structure" may refer to an imprint structure having a length and/or width and/or height in the micrometer range.

In accordance with some embodiments, the stamp device (e.g. stamp) may include an imprint pattern (also referred to as imprint structure) that may correspond to an inverse (or negative) of a mask structure or mask pattern (also referred to as three-dimensional (3D) mask structure or pattern) to be formed at least in the trench. In accordance with some embodiments, the imprint pattern may correspond to an inverse (or negative) of a 3D mask structure to be formed in the trench and over at least a part of the substrate surface. The 3D mask structure may correspond to the patterned imprint material that may be obtained by embossing the stamp device (e.g. stamp) (having the imprint pattern) onto the imprint material.

In accordance with some embodiments, the stamp device (e.g. stamp) may be configured such that the imprint pattern may reach at least partially into the trench when embossing the imprint material. In accordance with an embodiment, the trench and/or stamp device (e.g. stamp) may be configured such that a lower end of the stamp device (e.g. stamp) (illustratively, that end of the stamp device (e.g. stamp) that faces the bottom of the trench) may be spaced apart from the bottom of the trench when embossing the imprint material. In other words, in accordance with an embodiment, the depth of the trench may be such that the lower end of the stamp device (e.g. stamp) (or of the stamp device's imprint pattern) will not reach or contact the bottom of the trench when embossing the imprint material. Thus, a layer of imprint material may, for example, remain between the trench bottom and the lower end of the stamp device (e.g. stamp) when the stamp device (e.g. stamp) is placed in the trench. Therefore, a mask structure that may be formed by the embossed imprint material may cover the entire bottom of the trench in this case. In accordance with other embodiments, the stamp device (e.g. stamp) (or, more precisely, the imprint pattern of the stamp device (e.g. stamp)) may be configured such that the lower end of the stamp device (e.g. stamp) may reach the trench bottom. In this case, at least parts of the bottom of the trench may be free from imprint material after embossing. Therefore, a mask structure that may be formed by the embossed imprint material may cover parts of the bottom of the trench in this case.

In accordance with some embodiments, the imprint pattern of the stamp device (e.g. stamp) may have any shape that allows removal of the stamp device (e.g. stamp) from the trench without damaging a mask structure or mask pattern that may have been formed from the embossed (and possibly hardened) imprint material, illustratively any shape that allows embossing the imprint material such that the stamp device (e.g. stamp) (or, more precisely, its imprint structure or pattern) does not get caught or stuck in the embossed (and, possibly, hardened) imprint material.

Illustratively, in accordance with some embodiments, embossing imprint material in a trench and, possibly, over the substrate surface using a stamp device (e.g. stamp) may include patterning the imprint material to have a pattern that corresponds to a 3D mask structure to be formed in the trench and, possibly, over the substrate surface. In other words, a 3D mask structure may be obtained by embossing a stamp device (e.g. stamp) having an imprint pattern that corresponds to the inverse (or negative) of the 3D mask structure onto the imprint material.

In accordance with some embodiments, the 3D mask structure may be used for subsequent patterning processes, e.g. pattern plating processes, to obtain a three-dimensional (3D) pattern or structure such as, for example, a three-dimensional (3D) metallization structure or pattern, as will be described below.

In accordance with some embodiments, the stamp device (e.g. stamp) may include or may be made of a material that may be harder than the imprint material. In other words, in accordance with an embodiment the stamp device's material or materials may have a higher mechanical hardness than the imprint material.

In accordance with an embodiment, the stamp device (e.g. stamp) may include or may be made of a metal or a metal alloy (for example, similar to stamps used in audio compact disc (CD) production, in accordance with an embodiment). In accordance with an embodiment, the stamp device (e.g. stamp) may include or may be made of steel.

In accordance with an embodiment, the stamp device (e.g. stamp) may include or may be made of a flexible material. For example, the stamp device (e.g. stamp) may include or may be made of a polymer material, for example a silicone material in accordance with an embodiment, alternatively another polymer material. One effect of using a flexible material such as, for example, a polymer material may be seen in that a possible occurrence of scratches in the imprint material as a result of the embossing (imprinting) may be avoided or reduced.

In accordance with an embodiment, the stamp device (e.g. stamp) may include or may be made of a transparent material, for example in case that the imprint material is a photosensitive material that may be hardened by means of light irradiation. In accordance with an embodiment, the transparent material may for example be transparent for ultraviolet (UV) radiation, e.g. in case that a UV sensitive (or curable) material is used as imprint material. For example, in accordance with some embodiments, the stamp device (e.g. stamp) may include or may be made of a glass material, e.g. quartz glass material in accordance with one embodiment.

In accordance with an embodiment, the stamp device (e.g. stamp) may be provided (for example, fabricated or manufactured) using similar or analog processes as in standard nanoimprint manufacturing. Alternatively, the stamp device (e.g. stamp) may be provided using other suitable processes.

In accordance with some embodiments, in case that the imprint material is also deposited over the substrate surface, embossing the imprint material using the stamp device (e.g. stamp) may further include embossing the imprint material deposited over the substrate surface using the stamp device (e.g. stamp). Illustratively, in accordance with an embodiment, the stamp device (e.g. stamp) may have an imprint pattern that may be suitable for embossing structures in the trench and over the substrate surface.

In accordance with some embodiments, in case that the imprint material is a hardenable material the imprint material may be hardened after embossing the imprint material and before removing the stamp device (e.g. stamp) from the trench (see below).

For example, in case that a curable material such as, for example, a curable polymeric or polymerizable material (e.g. polymeric resist material, e.g. photo resist) is used, hardening the imprint material may include curing the imprint material. Illustratively, curing the imprint material may include cross-linking of polymer chains of the imprint material, as mentioned above.

In accordance with an embodiment, curing the imprint material (e.g. photosensitive resist material) may include exposing the imprint material to light radiation, for example ultraviolet (UV) light radiation (e.g. in case of an UV curable resist) in accordance with an embodiment.

In accordance with another embodiment, curing the imprint material (e.g. thermosensitive resist material) may include tempering the substrate (and thus the imprint material).

In accordance with another embodiment, curing the imprint material may include applying micro-wave radiation to the imprint material. For example, in accordance with an embodiment, the imprint material may include a matrix material, which may be a thermosensitive material, e.g. a thermosensitive polymer material, that may include nanoferrite particles that may be embedded in the matrix material. The nanoferrite particles may absorb energy from the electromagnetic field of the micro-wave radiation. This may lead to a heating of the nanoferrite particles in the matrix material. In this manner, heat from the embedded nanoferrite particles may be released directly and locally in the matrix material and the matrix material (e.g. polymer material) may be cured by the released heat.

In 108, the stamp device (e.g. stamp) may be removed from the trench.

Illustratively, in accordance with some embodiments, a three-dimensional (3D) mask structure may remain in the trench and, in accordance with some embodiments, over at least a part of the substrate surface after removal of the stamp device (e.g. stamp). The 3D mask structure may correspond to the patterned or structured (and, possibly, hardened or cured) imprint material (e.g. imprint resist).

In accordance with an embodiment, a flash and/or recess step may be performed after removal of the stamp device (e.g. stamp). The flash and/or recess step may, for example, be used to remove possible imprint material remainders (for example, thin polymer films, e.g. resist films) at e.g. sidewalls of the trench.

In accordance with an embodiment, filling material may be deposited into the trench after removal of the stamp device (e.g. stamp). In accordance with an embodiment, the filling material may be deposited after the flash and/or recess step (if provided).

In accordance with an embodiment, depositing the filling material may include filling at least parts of the trench that are free from the imprint material. Illustratively, the filling material may fill (at least partially) those parts of the trench that were occupied by the stamp device (e.g. stamp).

Illustratively, in accordance with some embodiments, depositing the filling material may include filling "non-imprint-material areas" in the trench, for example non-resist areas in case that a resist material is used as imprint material.

In accordance with some embodiments, the filling material may include or may be electrically conductive material such as, for example, metal. In accordance with an embodiment, the filling material may include or may be a metal, such as for example copper (Cu), alternatively any other suitable metal or metal alloy.

In accordance with an embodiment, depositing the filling material (e.g. metal) may include or may be accomplished by galvanic deposition of the filling material.

In accordance with an embodiment, depositing the filling material (e.g. metal) may include or may be accomplished by a plating process. In other words, the filling material (e.g. metal) may be deposited using a plating process (e.g. Cu plating).

Illustratively, in accordance with some embodiments, a 3D pattern or structure (e.g. 3D plating pattern or structure) may be formed by the filling material (e.g. metal). The 3D pattern or structure may illustratively correspond to the imprint pattern of the stamp.

In accordance with an embodiment, at least one additional trench may be formed in the substrate, the imprint material may be deposited into the at least one additional trench, the imprint material may be embossed using the stamp device (e.g. stamp), and the stamp device (e.g. stamp) may be removed from the at least one additional trench.

In accordance with an embodiment, embossing the imprint material in the at least one additional trench may be carried out after embossing the imprint material in the trench. Illustratively, in accordance with this embodiment, the substrate may be processed in a "step and repeat" sequence where the stamp device (e.g. stamp) may sequentially emboss the imprint material in a plurality of trenches.

In accordance with another embodiment, embossing the imprint material in the at least one additional trench and embossing the imprint material in the trench may be carried out simultaneously. Illustratively, in accordance with this embodiment, the substrate may be processed in an "all in one" manner where the stamp device (e.g. stamp) may emboss the imprint material in all of the trenches simultaneously (in other words, at once). In this case, the stamp device (e.g. stamp) may be configured in a suitable manner, for example such that it includes a plurality of imprint patterns (for example, one imprint pattern per trench). In accordance with an embodiment, the imprint patterns may all have the same shape, alternatively, they may have different shapes. Furthermore, in accordance with an embodiment, if hardening of the imprint material is provided, the imprint material in all of the trenches may be hardened simultaneously.

Figure 2:
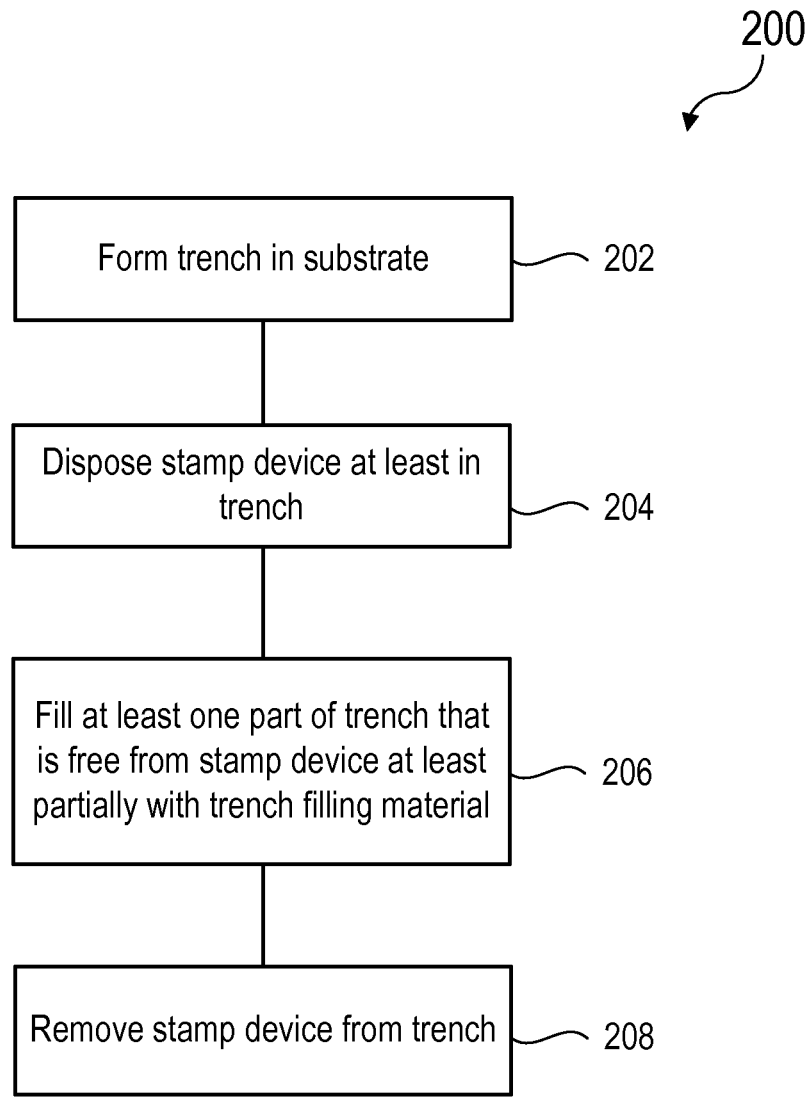
FIG. 2 is a diagram illustrating a method of processing a substrate in accordance with an embodiment.

FIG. 2 is a diagram illustrating a method 200 of processing a substrate in accordance with another embodiment.

In accordance with an embodiment, the substrate may be a semiconductor substrate, in other words a substrate that may include or may be made of one or more semiconducting materials. For example, the substrate may include or may be made of silicon (Si), alternatively any other suitable semiconductor material such as e.g. germanium (Ge), a IV-IV compound semiconductor (e.g. SiGe), a III-V compound semiconductor (e.g. GaAs), a II-VI compound semiconductor (e.g. CdTe), or any other suitable semiconductor material.

In accordance with an embodiment, the substrate may be or may include a wafer, or may be part of a wafer, for example a semiconductor wafer such as for example a silicon wafer, alternatively any other suitable semiconductor wafer.

In accordance with another embodiment, the substrate may be or may include a printed circuit board (PCB).

In 202, a trench may be formed in the substrate. The trench may be formed and/or configured in accordance with one or more embodiments described herein, for example by means of a trench process or by means of a cutting process, alternatively using any other suitable trench forming process.

In accordance with an embodiment, a bather layer may be deposited. The bather layer may be deposited before disposing a stamp in the trench (see below). Furthermore, the bather layer may be deposited and/or configured in accordance with one or more embodiments described herein.

In accordance with an embodiment, a seed layer may be deposited. The seed layer may be deposited before disposing a stamp device (e.g. stamp) in the trench (see below). Furthermore, the seed layer may be configured in accordance with one or more embodiments described herein.

In 204, a stamp device (e.g. stamp) may be disposed at least in the trench. The stamp device (e.g. stamp) may be configured in accordance with one or more embodiments described herein. For example, the stamp device may be configured as an imprint stamp that may include an imprint pattern in accordance with one or more embodiments described herein.

In 206, at least one part of the trench that is free from the stamp device (e.g. stamp) (e.g. one or more parts of the trench that are free from the imprint pattern of the stamp device (e.g. stamp)) may be filled at least partially with trench filling material. In other words, one or more "non-stamp" areas in the trench (i.e., areas of the trench that are free from the stamp device's imprint pattern when the stamp device (e.g. stamp) is disposed in the trench) may illustratively be filled with the trench filling material.

In accordance with some embodiments, the trench filling material may include or may be a hardenable material, for example a hardenable material in accordance with any of the embodiments described herein, for example a polymerizable material such as, for example, a curable polymer resist, e.g. a photo resist.

In accordance with some embodiments, the trench filling material may be deposited such that also parts over the substrate surface that are free from the stamp device (e.g. stamp) ("non-stamp areas" over the substrate surface) are filled with the trench filling material. For example, in accordance with some embodiments the trench filling material may be deposited such that parts or regions over the substrate surface that are located between the substrate surface and an upper part of the stamp device (e.g. stamp) may be filled with the trench filling material.

In accordance with an embodiment, in case that the trench filling material includes or is a hardenable material, the trench filling material may be deposited while it is in the non-hardened state.

In accordance with another embodiment, in case that the trench filling material includes or is a hardenable material, the trench filling material may be hardened after filling the trench and before removing the stamp device (e.g. stamp) from the trench (see below). The hardening of the trench filling material may be achieved in accordance with one or more embodiments described herein.

In 208, the stamp device (e.g. stamp) may be removed from the trench.

Illustratively, in accordance with some embodiments, a 3D mask structure may remain in the trench and, in accordance with some embodiments, over at least a part of the substrate surface when the stamp device (e.g. stamp) is removed from the trench. Illustratively, the 3D mask structure may correspond to the patterned or structured (and, possibly, hardened or cured) trench filling material (e.g. resist material).

In accordance with an embodiment, a flash and/or recess step may be performed after removal of the stamp device (e.g. stamp). The flash and/or recess step may, for example, be used to remove possible trench filling material remainders (for example, thin polymer films, e.g. resist films) at e.g. sidewalls of the trench.

In accordance with an embodiment, filling material may be deposited into the trench after removal of the stamp device (e.g. stamp). In accordance with an embodiment, the filling material may be deposited after the flash and/or recess step (if provided). Depositing the filling material may be achieved in accordance with one or more embodiments described herein. Furthermore, the filling material may be configured in accordance with one or more embodiments described herein. For example, in accordance with one embodiment, the filling material may include or may be electrically conductive material, for example metal (e.g. copper) that may serve to form one or more metallization structures.

In accordance with an embodiment, at least one additional trench may be formed in the substrate, the stamp device (e.g. stamp) may be disposed in the at least one additional trench, parts of the at least one additional trench that are free from the stamp device (e.g. stamp) may be filled with the trench filling material, and the stamp device (e.g. stamp) may be removed from the at least one additional trench.

In accordance with an embodiment, disposing the stamp device (e.g. stamp) in the at least one additional trench and filling the parts of the at least one additional trench with the trench filling material may be carried out after disposing the stamp device (e.g. stamp) in the trench and filling the parts of the trench with the trench filling material. Illustratively, in accordance with this embodiment, the substrate may be processed in a "step and repeat" sequence where the stamp device (e.g. stamp) may be sequentially disposed in a plurality of trenches.

In accordance with another embodiment, disposing the stamp device (e.g. stamp) in the at least one additional trench and disposing the stamp device (e.g. stamp) in the trench may be carried out simultaneously. Furthermore, in accordance with an embodiment, filling the parts of the at least one additional trench and filling the parts of the trench with the trench filling material may be carried out simultaneously. Illustratively, in accordance with this embodiment, the substrate may be processed in an "all in one" manner where e.g. the stamp device (e.g. stamp) may be simultaneously (in other words, at once) disposed in all of the trenches and/or the trenches may be filled simultaneously with the trench filling material. In this connection, the stamp device (e.g. stamp) may be configured in a suitable manner, for example, in an embodiment, having a plurality of imprint patterns as described above in connection with FIG. 1. Furthermore, in accordance with an embodiment, if hardening of the trench filling material is provided, the trench filling material in all of the trenches may be hardened simultaneously.

In a method of processing a substrate (for example a semiconductor substrate such as e.g. a wafer, e.g. a silicon wafer) in accordance with an embodiment a trench may be formed in the substrate (for example, by means of a trench etch process), imprint material may be deposited over the substrate, thereby filling the trench at least partially with the imprint material, the imprint material in the trench may be embossed by means of an imprint stamp having an imprint pattern reaching at least partially into the trench, and the imprint stamp may be removed from the trench. In accordance with an embodiment, the imprint material may be an imprint resist such as, for example, a polymer resist, e.g. a photo resist. In accordance with an embodiment, the imprint pattern may correspond to the inverse of a three-dimensional mask structure to be formed by the imprint material, and the embossed imprint material may have a pattern that may correspond to the three-dimensional mask structure. In accordance with an embodiment, the imprint material may include or may be a hardenable material (e.g. a curable polymer material such as, for example, a polymer resist, e.g photo resist) and may be hardened (for example cured, e.g. by means of light irradiation, e.g. UV light irradiation) after embossing and before removal of the stamp. In accordance with an embodiment, filling material may be deposited over the substrate after the removal of the stamp, thereby filling at least parts of the trench that are free from the imprint material. In accordance with an embodiment, the filling material may include or may be electrically conductive material such as, for example, metal (e.g. copper).

In a method of processing a substrate (for example a semiconductor substrate such as e.g. a wafer, e.g. a silicon wafer) in accordance with another embodiment, a trench may be formed in the substrate (for example, by means of a trench etch process), an imprint stamp having an imprint pattern may be disposed over the substrate such that the imprint pattern reaches at least partially into the trench, parts of the trench that are free from the imprint pattern of the imprint stamp may be filled at least partially with trench filling material, and the imprint stamp may be removed from over the substrate. In accordance with an embodiment, the imprint pattern may correspond to the inverse of a three-dimensional mask structure to be formed by the trench filling material, and after filling the parts of the trench with the trench filling material, the trench filling material may have a pattern that may correspond to the three-dimensional mask structure. In accordance with an embodiment, the trench filling material may include or may be a hardenable material (e.g. a curable polymer material such as, for example, a polymer resist, e.g photo resist) and may be hardened (for example cured, e.g. by means of light irradiation, e.g. UV light irradiation) after filling the parts of the trench with the trench filling material and before removal of the imprint stamp. In accordance with an embodiment, filling material may be deposited over the substrate after the removal of the imprint stamp, thereby filling at least parts of the trench that are free from the trench filling material. In accordance with an embodiment, the filling material may include or may be electrically conductive material such as, for example, metal (e.g. copper).

Figure 3:
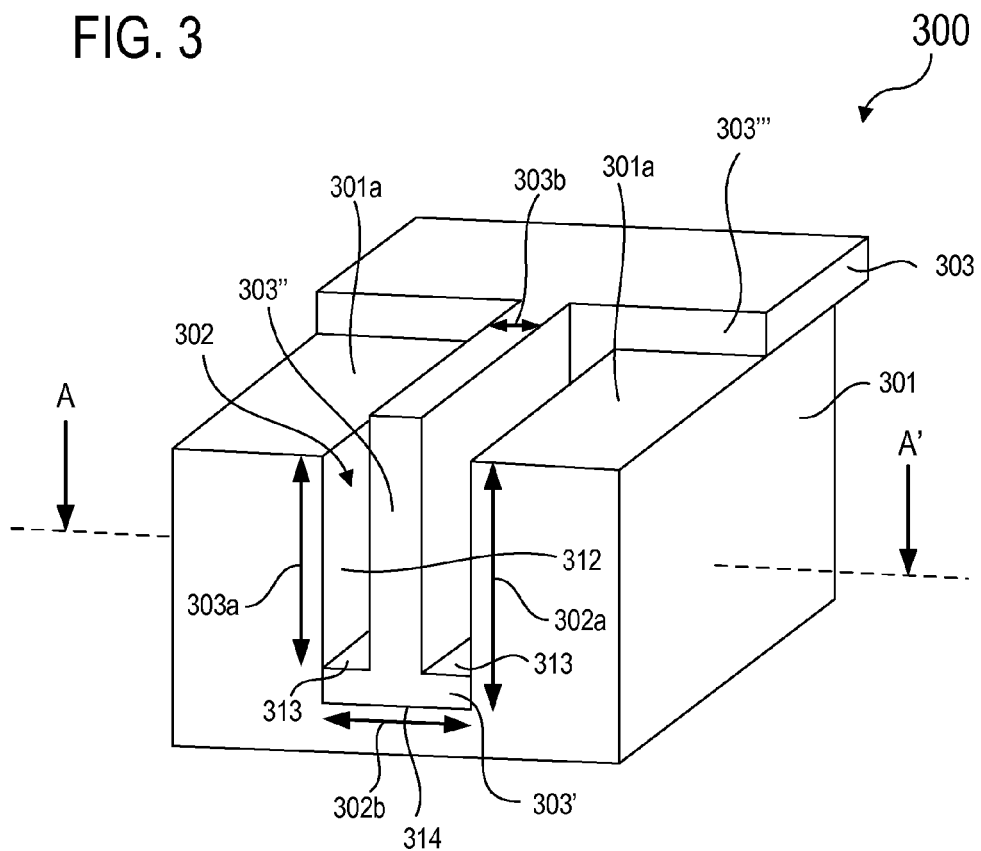
FIG. 3 shows a schematic perspective view of an exemplary three-dimensional structure that may be obtained by means of a method of processing a substrate in accordance with an embodiment.

FIG. 3 shows a perspective view of an exemplary three-dimensional (3D) structure 300 (also referred to as target structure) that may be obtained by means of a method of processing a substrate in accordance with an embodiment.

The structure 300 includes a substrate 301. The substrate 301 may be a semiconductor substrate, e.g. a silicon (Si) substrate in accordance with an embodiment. For example, the substrate 301 may be part of a silicon wafer in accordance with an embodiment.

A trench 302 is formed in the substrate 301, as shown. The trench 302 may have been formed, for example, by means of an etch process, or by means of a cutting process in accordance with an embodiment, alternatively by means of any other suitable trench formation process.

A depth of the trench 302 (illustratively, a distance from a trench bottom 314 to an upper substrate surface 301a) is indicated by double arrow 302a in FIG. 3. In accordance with some embodiments, the trench depth 302a may be smaller than the thickness of the substrate 301 (e.g. wafer). In accordance with some embodiments, the trench depth 302a may be in the micrometer range. For example, the trench depth 302a may have a value of one or several micrometers, or of several tens of micrometers or of several hundreds of micrometers. For example, in accordance with some embodiments, the trench depth 302a may be in the range from about 100 µm to about 300 µm, for example about 300 µm in accordance with one embodiment. In accordance with other embodiments, the trench depth 302a may have different values.

A width of the trench 302 (illustratively, a distance of opposing sidewalls 312 of the trench 302) is indicated by double arrow 302b in FIG. 3. In accordance with some embodiments, the trench width 302b may be in the micrometer range. For example, in accordance with some embodiments, the trench width 302b may be in the range from about 10 µm to about 200 µm, for example about 50 µm in accordance with one embodiment. In accordance with other embodiments, the trench width 302b may have different values.

In accordance with other embodiments, three-dimensional structures with other geometries (e.g. other trench geometries) may be realized in a similar manner as the structure 300 shown in FIG. 3. These structures may have similar or different dimensions, for example similar or different trench dimensions, e.g. similar or different trench depths and/or trench widths.

The target structure 300 further includes a three-dimensional (3D) mask structure 303 that is formed in the trench 302 and over parts of the substrate 301 (more precisely, over parts of the upper surface 301a of the substrate 301).

The mask structure 303 may include or may be made of an imprint material such as, for example, an imprint resist (e.g. polymeric resist). In accordance with some embodiments, the mask structure 303 may have been obtained by depositing the imprint material into the trench 302 and embossing the imprint material using a stamp device (for example, a stamp or imprint stamp) that has an imprint pattern corresponding to the inverse of the mask structure 303.

Alternatively, the mask structure 303 may have been obtained by disposing a stamp device (e.g. a stamp or imprint stamp) in the trench 302 and over the upper surface 301a of the substrate 301 and filling at least parts of the trench 302 that are free from the stamp device (e.g. a stamp or imprint stamp) with trench filling material (for example, hardenable material such as a polymeric resist).

As shown, the mask structure 303 may include a first portion 303' that may be located in the trench 302 and may cover the bottom 314 of the trench 302, as shown. As shown, a width of the first portion 303' of the mask structure 303 may be the same as the width 302b of the trench 302. In other words, the first portion 303' may abut the sidewalls 312 of the trench 302.

In accordance with some embodiments, a thickness of the first portion 303' of the mask structure 303 may be in the micrometer range, for example on the order of several micrometers or several tens of a micrometer in accordance with one embodiment. In accordance with other embodiments, the thickness may have different values.

In FIG. 3, double arrow 303a indicates a distance between an upper surface 313 of the first portion 303' of the mask structure 303 and the upper surface 301a of the substrate 301. Illustratively, the distance 303a may correspond to the trench depth 302a minus the thickness of the first portion 303' of the mask structure 303 and may be in the micrometer range, for example on the order of several tens or several hundreds of a micrometer. For example, in accordance with an exemplary embodiment, the distance 303a may be about 250 µm. In accordance with other embodiments, the distance 303a may have different values.

In accordance with the embodiment shown, the mask structure 303 may further include a second portion 303" that may be located in the trench 302 and may have a width (indicated by double arrow 303b in FIG. 3) that may be smaller than the width 302b of the trench 302 such that portions of the trench 302 are free from material of the mask structure 303. Illustratively, a middle portion (second portion 303") of the mask structure 303 may have a bar shape or ridge shape in accordance with the embodiment shown in FIG. 3. A part of the second portion 303" of the mask structure 303 may protrude from the trench 302 in accordance with the embodiment shown.

In accordance with the embodiment shown, the mask structure 303 may further include a third portion 303''' that may cover parts of the substrate 301 (more precisely, parts of the upper surface 301a of the substrate 301).

The first portion 303' of the mask structure 301 that covers the bottom 314 of the trench 302 may serve to prevent filling material (e.g. electrically conductive material such as, for example, metal that may be filled into the trench 302 after the mask structure 303 has been formed, as will be described below) from reaching the bottom 314 of the trench 302. In accordance with another embodiment, the first portion 303' may not be present or may have a smaller width than the trench (for example, the same width as the second portion 303" of the mask structure 303) (not shown). Thus, in accordance with this embodiment, at least parts of the bottom 314 of the trench 302 may be free from material of the mask structure 303. In this case, filling material (e.g. electrically conductive material such as, for example, metal) that may be filled into the trench 302 after the mask structure 303 has been formed may reach the bottom 314 of the trench 302.

Illustratively, FIG. 3 shows an exemplary three-dimensional (target) structure 300 including a three-dimensional (3D) mask structure 303. In order to obtain the target structure 300, material (e.g. resist) forming the mask structure 303 needs to be structured not only on top of the substrate surface 301a but also in the trench 302. In accordance with some embodiments, the structured or patterned mask structure 303 may be achieved by means of depositing imprint material (e.g. imprint resist) in the trench 302 and over the substrate surface 301a and embossing the imprint material with a stamp device (e.g. a stamp or imprint stamp) having a three-dimensional (3D) imprint pattern that corresponds to the inverse of the 3D mask structure 303, as will be described further below. In accordance with other embodiments, the structured or patterned mask structure 303 may be achieved by means of disposing a stamp device (e.g. imprint stamp) in the trench 302 and over the substrate surface 301a and subsequently filling parts of the trench 302 and over the substrate surface 301a that are free from the stamp device (e.g. stamp or imprint stamp) with trench filling material (e.g. hardenable material such as, for example, resist).

It is noted that forming 3D target structures such as the structure 300 shown in FIG. 3 may not be possible at all or may be comparatively costly (e.g. require a high number of process steps) using conventional approaches. For example, standard lithography may fail as the required resist thicknesses cannot be exposed accordingly (e.g. due to insufficient depth of focus of the exposure tools, occurrence of stray light at edges, instability of the resist wall(s) due to solvent loss during bake-out processes, etc.). On the other hand, two-photon lithography may fail as the structure in the deep trench cannot be accessed. Finally, standard nano-imprint processes may not be used as they are designed for printing structures on plain surfaces only.

Figure 4:
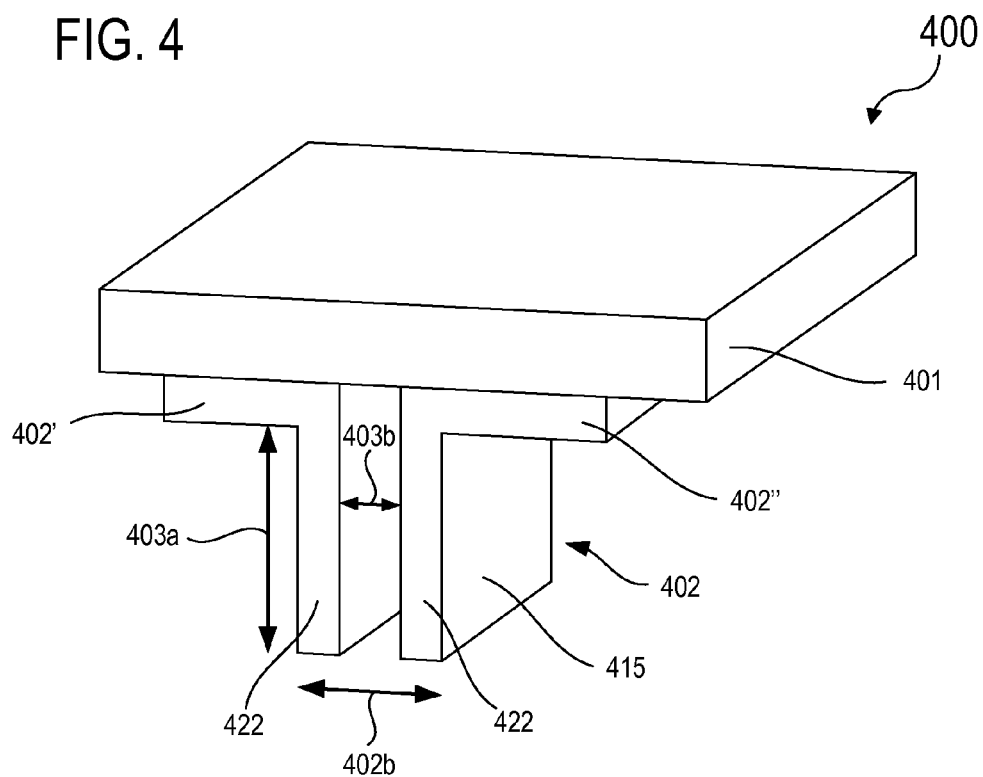
FIG. 4 shows a schematic perspective view of a stamp device configured as a stamp that may be used in a method of processing a substrate to obtain the three-dimensional structure of FIG. 3 in accordance with an embodiment.

FIG. 4 shows a schematic perspective view of a stamp device 400 that may be used in a method of processing a substrate. In accordance with the embodiment shown, the stamp device 400 is configured as a stamp. The stamp device 400 or stamp 400 may be used to obtain the three-dimensional target structure 300 of FIG. 3.

The stamp 400 may be configured as an imprint stamp and may include or may be made of a material that may be suited to emboss the material (e.g. imprint resist) of the mask structure 303. In accordance with one embodiment, the stamp 400 may be made of a transparent material, e.g. of a UV transparent material, for example in case that an imprint material that is to be embossed by the stamp 400 is configured as a hardenable material that may be hardened by means of irradiation (e.g. UV irradiation). In accordance with other embodiments, the stamp 400 may include or may be made of other materials, for example a flexible material such as, for example, a polymer material (e.g. a silicone material) in accordance with one embodiment, or a metal or metal alloy.

In accordance with the embodiment shown, the stamp 400 may include a planar upper portion 401 that may correspond to a base-mask. Furthermore, the stamp 400 may include an imprint pattern 402 that illustratively corresponds to an inverse (or negative) of the 3D mask structure 303 shown in FIG. 3.

In accordance with the embodiment shown, the imprint pattern 402 includes two L-shaped portions 402' and 402" arranged mirror-symmetrically and configured in such a manner that the 3D mask structure 303 of FIG. 3 may be obtained by embossing imprint material in the trench 302 and over the substrate surface 301a using the stamp 400 or by filling parts of the trench 302 and over the substrate surface 301a that are free from the imprint pattern 402 with trench-filling material, as will be described below.

It is noted that, in accordance with other embodiments, the imprint pattern of a stamp device (e.g. of a stamp, or of a roll) may have a shape that may be different from the one shown in FIG. 4. For example, the imprint pattern may not need to have the two L-shaped portions shown in FIG. 4. In general, the shape of the imprint pattern of a stamp device (e.g. of a stamp, or of a roll) may depend on the three-dimensional mask structure or target structure to be formed using the stamp device. For example, in accordance with some embodiments, any shape or pattern that is free from undercuts (in other words, that does not have any undercuts) may be suitable for use as imprint pattern.

In accordance with the embodiment shown, each of the two L-shaped portions 402', 402" of the imprint pattern 402 includes a vertical section 422 (extending in a direction perpendicular to the main surface of the base-mask) with an extension (denoted by double arrow 403a) that corresponds to the distance 303a shown in FIG. 3. The vertical sections 422 may reach into the trench 302 when the stamp 400 is used for embossing the imprint material in the trench 302 (see e.g. FIG. 5D) or when the stamp 400 is disposed in the trench 302 before depositing the trench filling material (see e.g. FIG. 9C). Furthermore, a distance 403b between the two L-shaped portions 402', 402" corresponds to the width 303b of the second portion 303" of the 3D mask structure 303 (see e.g. FIG. 5D and FIG. 9D). Furthermore, a distance 402b between respective outer sidewalls 415 of the two L-shaped portions 402', 402" of the imprint pattern 402 corresponds to the width 302b of the trench 302 (see e.g. FIG. 5D and FIG. 9C). In other words, the value of the distance 402b may be the same or approximately the same as the value of the trench width 302b.

The two L-shaped portions 402', 402" of the imprint pattern 402 may also be referred to as micro-imprint structures (μ-imprint structures). The stamp 400 may also be referred to as micro-imprint mask (μ-imprint mask).

In accordance with some embodiments, the 3D mask structure 303 shown in FIG. 3 may be obtained by embossing imprint material in the trench 302 using the stamp 400 shown in FIG. 4, as will be described below in connection with FIGS. 5A to 5E. In accordance with other embodiments, the 3D mask structure 303 shown in FIG. 3 may be obtained by disposing the stamp 400 of FIG. 4 in the trench 302 and filling parts of the trench 302 that are free from the stamp 400 with trench filling material, as will be described below in connection with FIGS. 9A to 9E. The 3D mask structure 303 may, for example, subsequently be used to form one or more 3D metallization structures, as will be described below in connection with FIG. 5F and FIG. 5G. The metallization structures may, for example, be used for electrically contacting one or more electrical or electronic elements or devices of one or more dies or chips, as will be described below in connection with FIGS. 6 to 8.

In the following, a method of processing a substrate in accordance with an embodiment is described in connection with FIGS. 5A to 5E, which show different process stages as schematic cross-sectional views.

Figure 5A:
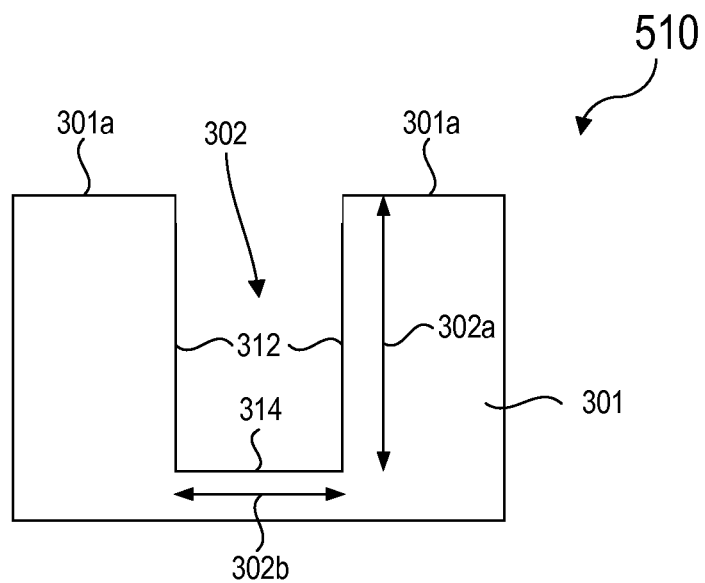
FIGS. 5A to 5G show schematic cross-sectional views of a substrate for illustrating different stages in a method of processing a substrate in accordance with an embodiment.

FIG. 5A shows in a first view 510 that a trench 302 is formed in a substrate 301. The substrate 301 includes an upper surface 301a and may further be configured in accordance with one or more embodiments described herein, for example as a semiconductor substrate, for example as a wafer, e.g. as a silicon wafer.

The trench 302 may be formed in accordance with one or more embodiments described herein, for example using a standard trench etch process. The trench 302 includes sidewalls 312 and a bottom 314. A depth of the trench 302 is indicated by double arrow 302a and may, for example, have a value in accordance with one or more embodiments described herein. Furthermore, a width of the trench 302 is indicated by double arrow 302b and may, for example, have a value in accordance with one or more embodiments described herein.

In accordance with an embodiment, a barrier layer may be deposited over at least the sidewalls 312 of the trench 302 (not shown). In accordance with another embodiment, a seed layer may be deposited over the bather layer (not shown). In accordance with other embodiments, the bather layer and/or seed layer may be omitted.

Figure 5B:
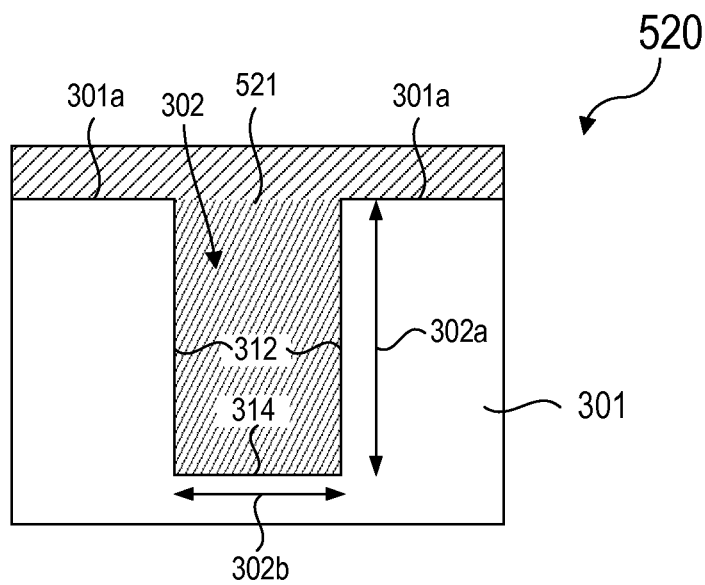

FIG. 5B shows in a second view 520 that the substrate 301 (e.g. the wafer) is coated with a thick layer of imprint material (e.g. imprint resist) 521. As shown, the imprint material 521 may fill the trench 302 and cover at least parts of the upper surface 301a of the substrate 301. The imprint material 521 may be patterned or structured by imprinting as will be described herein below. In accordance with some embodiments, the imprint material may be a hardenable material, for example a curable polymeric material such as e.g. a polymer resist, for example a photoresist that may be cured by means of irradiation (e.g. UV irradiation).

Figure 5C:
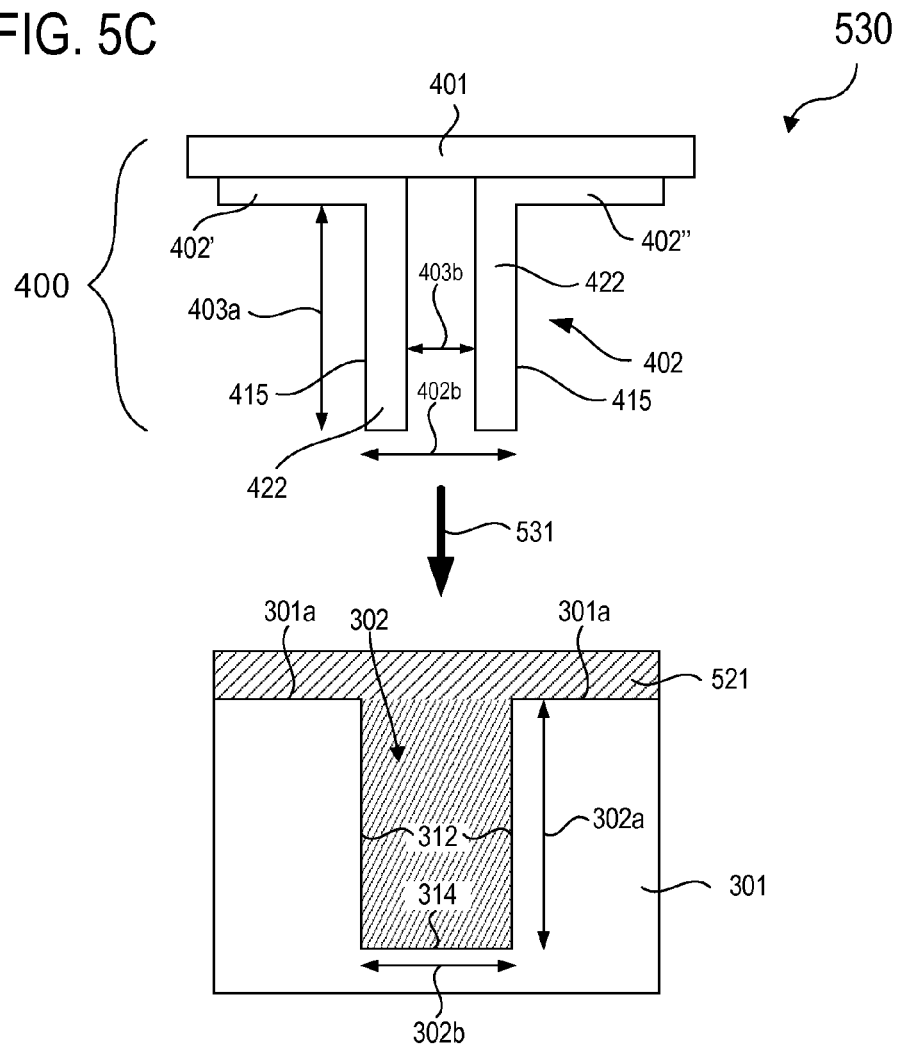
Figure 5D:
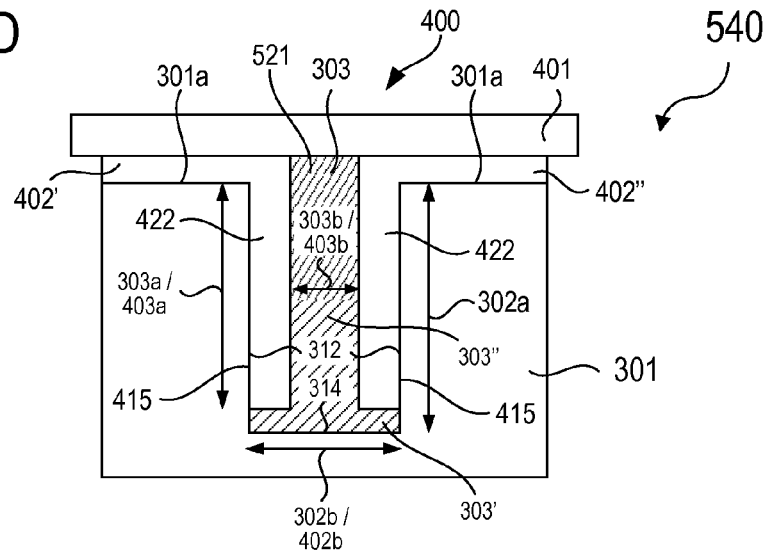

FIG. 5C shows in a third view 530 that the imprint material 521 is imprinted by embossing a stamp 400 onto the imprint material 521. The embossing is indicated by arrow 531 in FIG. 5C. The stamp 400 may be configured in a similar manner as the stamp described herein above in connection with FIG. 4. In particular, the same reference numerals may denote the same elements as in FIG. 4. By means of embossing the stamp 400 onto the imprint material 521 the imprint material 521 (e.g. imprint resist) may be patterned to form a three-dimensional mask structure 303 as is shown in a fourth view 540 in FIG. 5D. The three-dimensional mask structure 303 may have a similar shape as shown in FIG. 3. In particular, the same reference numerals may denote the same elements as in FIG. 3.

In accordance with some embodiments, the three-dimensional mask structure 303 (more precisely, the imprint material 521 of the three-dimensional mask structure 303) may be hardened after imprinting. In accordance with some embodiments, the hardening may be achieved by means of light irradiation (e.g. UV irradiation). In this case, the stamp 400 may be made of a light transparent (e.g. UV transparent) material in order to let the light (e.g. UV radiation) pass, and the imprint material 521 may be a material that may be hardened by means of light irradiation (e.g. UV irradiation) such as, for example, a photosensitive (e.g. UV sensitive) polymeric resist.

Figure 5E:
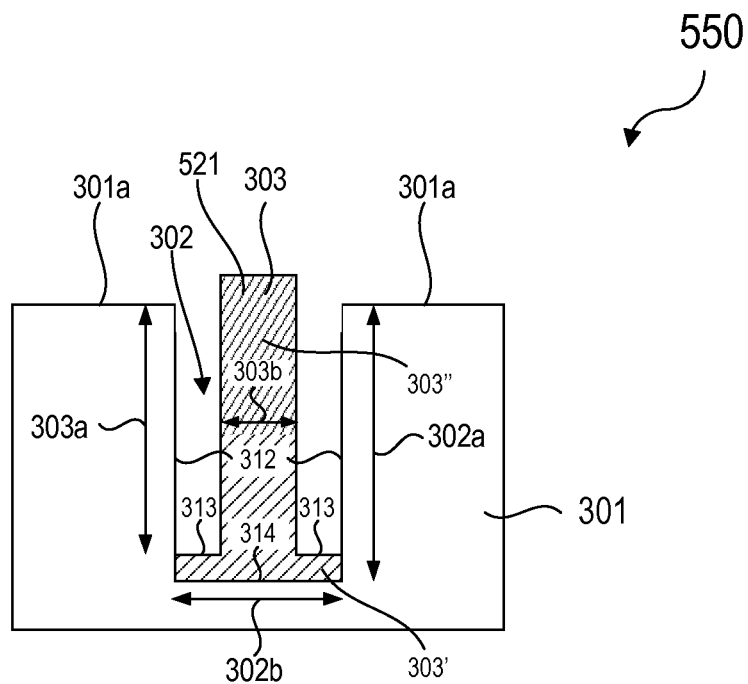

FIG. 5E shows in a fifth view 550 that the stamp 400 is removed from the trench 302. As shown, the three-dimensional mask structure 303 including the first portion 303' and the second portion 303" remains in the trench 302. It is noted that the three-dimensional mask structure 303 may further include the third portion 303'" that may cover parts of the upper surface 301a of the substrate 301, which is shown in FIG. 3 but is not shown in FIG. 5E as the fifth view 550 clearly corresponds to a cross-section along the cross-sectional line A-A' in FIG. 3.

Illustratively, in accordance with some embodiments, a three-dimensional (3D) stamp 400 may be embossed onto a substrate 301 coated with imprint material 521 (e.g. imprint resist). In accordance with some embodiments, the imprint material 521 may be hardened after embossing and before removal of the stamp 400. For example, in accordance with an embodiment where the imprint material 521 is a photosensitive resist material, the resist may be exposed to light in order to crosslink polymer chains in the resist material. In this case, the stamp 400 may be configured as a transparent stamp to let pass the light used for exposure of the resist. In accordance with other embodiments, crosslinking (or change of solubility) of resist like polymers may also be achieved by applying elevated temperatures or electrical voltages.

In accordance with an embodiment, a cleaning step such as, for example, a flash/recess step may be performed after removal of the stamp 400 to remove possible remainders of the imprint material 521 (e.g. thin polymer films (e.g. resist films)) from e.g. the sidewalls 312 of the trench 302.

Figure 5F:
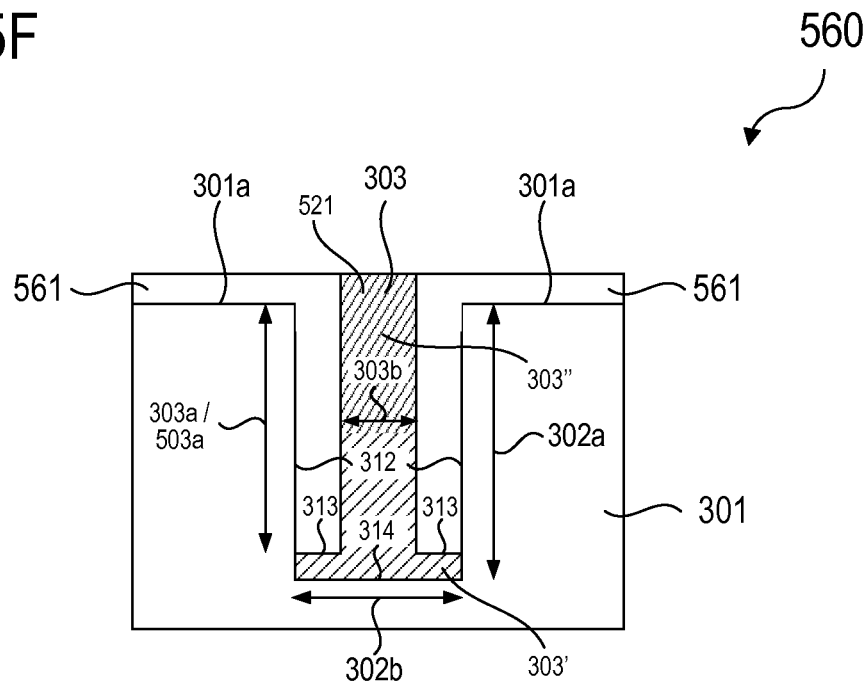

In accordance with some embodiments, the three-dimensional (3D) mask structure 303 (e.g. 3D polymer mask) may be used for subsequent metallization processes such as pattern plating processes, where the non-imprint-material areas (clearly, those parts of the trench 302 and over the upper surface 301a of the substrate 301 that are free from imprint material 521) (i.e. non-resist areas in case that the imprint material 521 is a resist material) may be galvanically filled with metal 561 (e.g. copper (Cu)), as is shown in a sixth view 560 in FIG. 5F.

In accordance with the embodiment shown, the metal 561 extends into the trench 302 up to the upper surface 313 of the first portion 303' of the mask structure 303, that is up to a depth 503a that corresponds to the distance 303a, as is shown in FIG. 5F. Thus, in accordance with the embodiment shown, the metal 561 is spaced apart from the trench bottom 314 by means of the first portion 303' of the mask structure 303 that covers the trench bottom 314. In accordance with other embodiments, the mask structure 303 may be configured such that the metal 561 reaches the trench bottom 314.

Figure 5G:
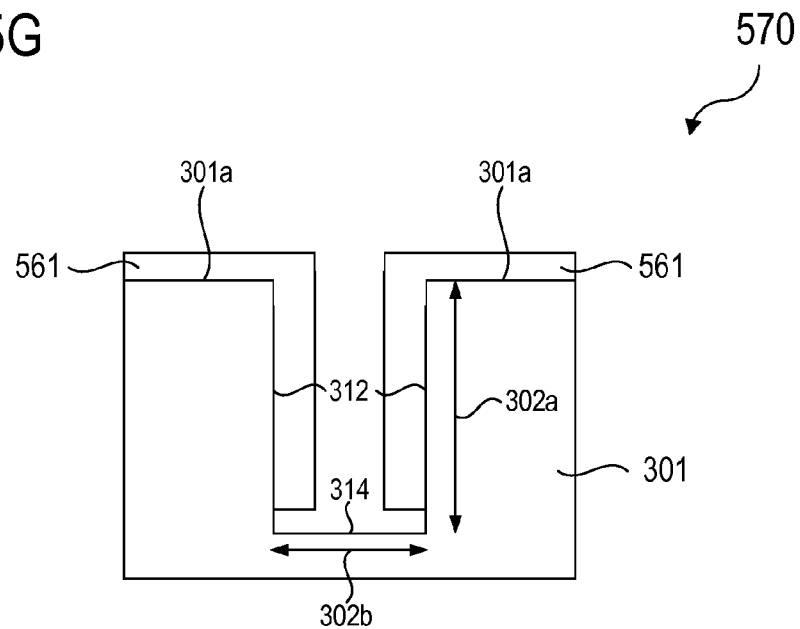

After filling the non-imprint-material areas with the metal 561, the 3D mask structure 303 may be removed (using, for example, a suitable process for selectively removing the material (e.g. resist) of the mask structure 303 while the metal 561 remains in the trench 303 and over the substrate surface 301a), as is shown in a seventh view 570 in FIG. 5G. The metal 561 may, for example, serve as one or more metallization structures to electrically contact one or more electrical and/or electronic devices that may be or may have been formed in the substrate 301, as is shown in FIG. 6.

Figure 6:
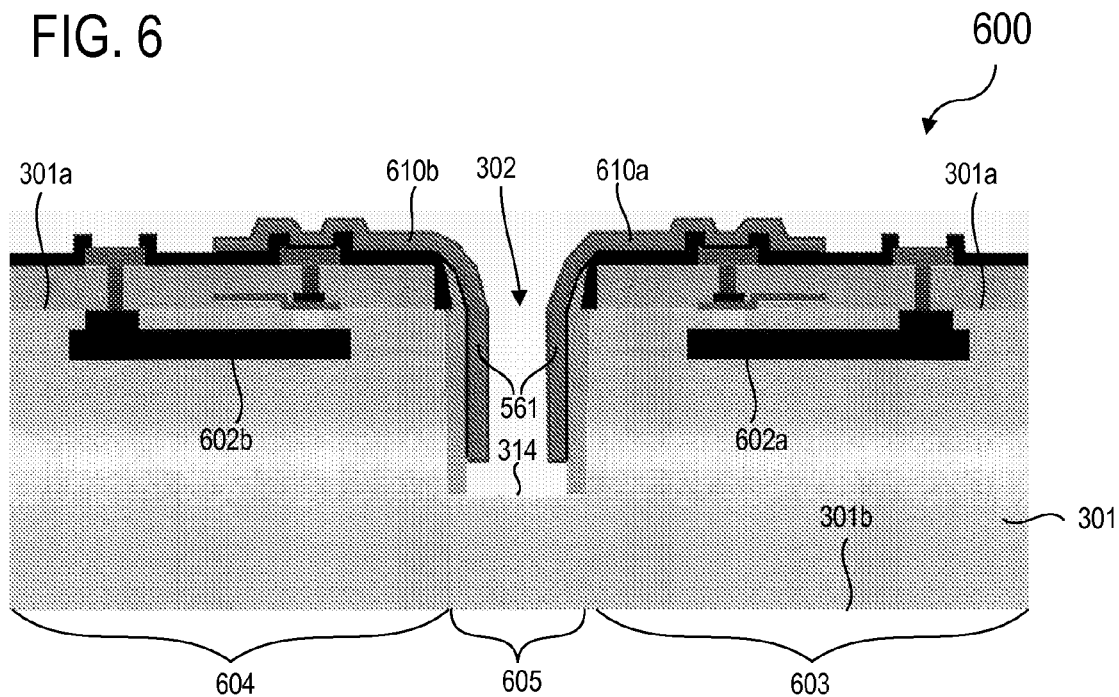
FIG. 6 shows a schematic cross-sectional view of a substrate for illustrating formation of metallization structures using a method of processing a substrate in accordance with an embodiment.

FIG. 6 shows a schematic cross-sectional view 600 of a substrate 301 for illustrating formation of metallization structures using a method of processing a substrate in accordance with an embodiment. The substrate 301 may be a wafer or may be part of a wafer. A trench 302 has been formed in the substrate 301, and a first metallization structure 610a and a second metallization structure 610b have been formed in the trench 302 and over the upper surface 301a of the substrate 301. The trench 302 and the first and second metallization structures 610a, 610b may have been formed by means of a method of processing a substrate in accordance with one or more embodiments described herein, for example in a similar manner as described above in connection with FIG. 5A to FIG. 5G. The first metallization structure 610a serves to electrically contact at least one first electronic device 602a that is located in the substrate 301. The second metallization structure 610b serves to electrically contact at least one second electronic device 602b located in the substrate 301.

The at least one first electronic device 602a may be located in a first region 603 of the substrate 301 that may correspond to a first die to be formed from the substrate 301, and the at least one second electronic device 602b may be located in a second region 604 of the substrate 301 that may correspond to a second die to be formed from the substrate 301, as shown. The first region 603 and the second region 604 of the substrate 301 may be located adjacent to one another and may be joined by a third region 605 of the substrate 301 located between the first region 603 and the second region 604 of the substrate 301 and between the bottom 314 of the trench 302 and a lower surface 301b of the substrate 301, as shown. In accordance with an embodiment, the first die and the second die may be obtained using a die singulation process. In other words, the first region 603 and the second region 604 of the substrate 301 may be separated from one another (for example, by means of a die cutting process) thereby removing the third region 605 (that is the linking part) between the first region 603 and the second region 604 of the substrate 301.

In addition to the trench 302 and the first and second metallization structures 610a, 610b shown in FIG. 6, additional trenches (not shown) may have been formed in the substrate 301 and additional metallization structures (not shown) may have been formed in the additional trenches and over the upper surface 301a of the substrate 301 in a similar manner as the trench 302 and the first and second metallization structures 610a, 610b. The additional metallization structures may serve to electrically contact the first electronic device 602a and/or the second electronic device 602b and/or additional electronic devices that may, for example, be located in additional regions of the substrate 301 that may correspond to additional dies to be formed from the substrate 301. The additional dies may, for example, be obtained using a die singulation process, in which the additional regions of the substrate may be separated from one another (in other words, the dies may be singulated).

Figure 7:
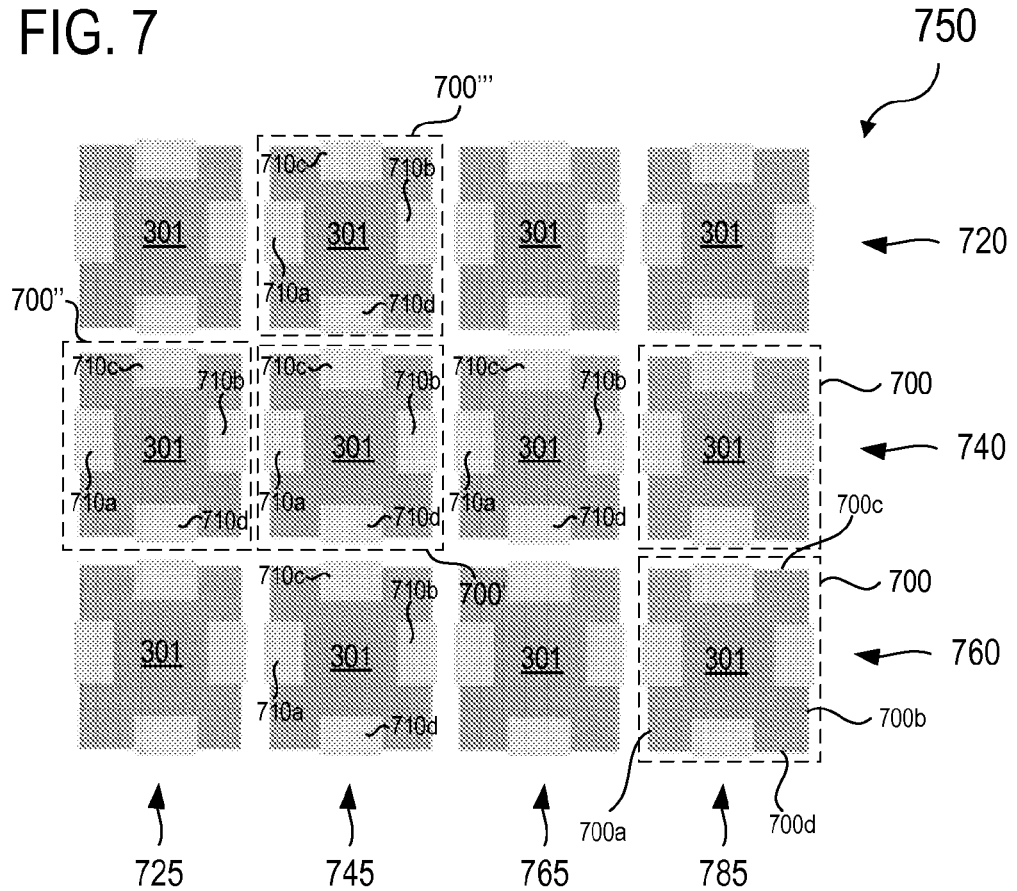
FIG. 7 shows a schematic top view of a die array for illustrating formation of die metallization structures using a method of processing a substrate in accordance with an embodiment.

Thus, illustratively, in accordance with some embodiments, a die arrangement or die array including a plurality of dies (or chips) and a plurality of die metallization structures to electrically contact the dies may be provided as is shown in FIG. 7.

FIG. 7 shows a schematic top view of a die array 750 for illustrating formation of die metallization structures using a method of processing a substrate in accordance with an embodiment. The die array 750 includes a plurality of dies (chips) 700 arranged in rows 720, 740, 760 and columns 725, 745, 765, 785 (in this example, twelve dies 700 are arranged in a rectangular array including a first row 720, a second row 740, and a third row 760, and a first column 725, a second column 745, a third column 765, and a fourth column 785; in general, an arbitrary number of dies 700 may be arranged in an arbitrary number of rows and columns). The dies 700 may have been obtained from a common substrate 301 (e.g. a wafer) by means of die singulation. Each die 700 includes a plurality of die metallization structures 710a, 710b, 710c, 710d. In the example shown, a first die metallization structure 710a, a second die metallization structure 710b, a third die metallization structure 710c and a fourth die metallization structure 710d are provided for each die 700. As shown, each die 700 may have a rectangular (e.g. quadratic) shape including four side surfaces 700a, 700b, 700c, 700d, and the die metallization structures 710a, 710b, 710c, 710d may be arranged at the four side surfaces 700a, 700b, 700c, 700d of the die 700, as shown. In particular, the first die metallization structure 710a and the second die metallization structure 710b are located at first and second side surfaces 700a, 700b of the die 700 that are opposite to one another, and the third die metallization structure 710c and the fourth die metallization structure 710d are located at third and fourth side surfaces 700c, 700d of the die 700 that are opposite to one another, as shown. In accordance with other embodiments, a different number of die metallization structures per die may be provided and/or the die metallization structures may be arranged differently. The die metallization structures 710a, 710b, 710c, 710c may be used to electrically contact one or more electronic devices of the respective die 700.

The die metallization structures 710a, 710b, 710c, 710d may have been formed by means of a method of processing a substrate in accordance with one or more embodiments described herein, for example in a similar manner as described above in connection with FIG. 5A to FIG. 5G.

Illustratively, the first die metallization structure 710a of a given die 700 and the second die metallization structure 710b of a nearest-neighbor die 700 in the same row may have been formed using a common three-dimensional mask structure formed in a trench located between the two neighboring dies. For example, the first die metallization structure 710a of a first die 700' of the plurality of dies 700 that is located at the cross-point of the second row 740 with the second column 745 and the second die metallization structure 710b of a second die 700" of the plurality of dies 700 that is located at the cross-point of the second row 740 with the first column 725 may have been formed using a common three-dimensional mask structure formed in a trench located between the two neighboring dies 700', 700".

Similarly, the third die metallization structure 710c of a given die 700 and the fourth die metallization structure 710d of a nearest-neighbor die 700 in the same column may have been formed using a common three-dimensional mask structure formed in a trench located between the two neighboring dies. For example, the third die metallization structure 710c of the first die 700' located at the cross-point of the second row 740 with the second column 745 and the fourth die metallization structure 710d of a third die 700''' located at the cross-point of the first row 720 with the second column 745 may have been formed using a common three-dimensional mask structure formed in a trench located between the two neighboring dies 700', 700'''.

Illustratively, the die array 750 shown in FIG. 7 is configured such that each die (chip) 700 of the plurality of dies 700 includes four contacts (e.g. pins).

Figure 8:
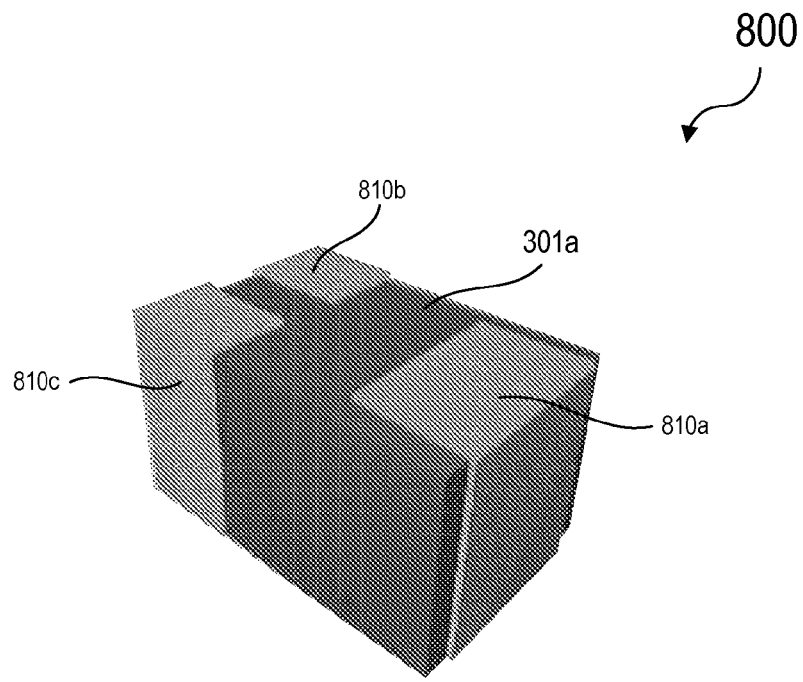
FIG. 8 shows a schematic perspective view of a die for illustrating formation of die metallization structures using a method of processing a substrate in accordance with an embodiment.

FIG. 8 shows a schematic perspective view 800 of a die for illustrating formation of die metallization structures using a method of processing a substrate in accordance with another embodiment.

The die 800 includes three die metallization structures 810a, 810b, 810c that are configured as surface and sidewall contacts. In other words, the die metallization structures 810a, 810b, 810c are formed over the upper surface and the sidewalls of the die 800. The die metallization structures 810a, 810b, 810c may be formed by galvanic deposition after structuring a three-dimensional mask (e.g. resist mask) using a method of processing a substrate in accordance with one or more embodiments, for example in a similar manner as described above in connection with FIGS. 5A to 5G.

Illustratively, FIG. 8 shows another example of a target product (i.e. a die with die metallizations) that may be obtained using a method of processing a substrate in accordance with an embodiment.

In the following, a method of processing a substrate in accordance with another embodiment is described in connection with FIGS. 9A to 9E, which show different process stages as schematic cross-sectional views.

Figure 9A:
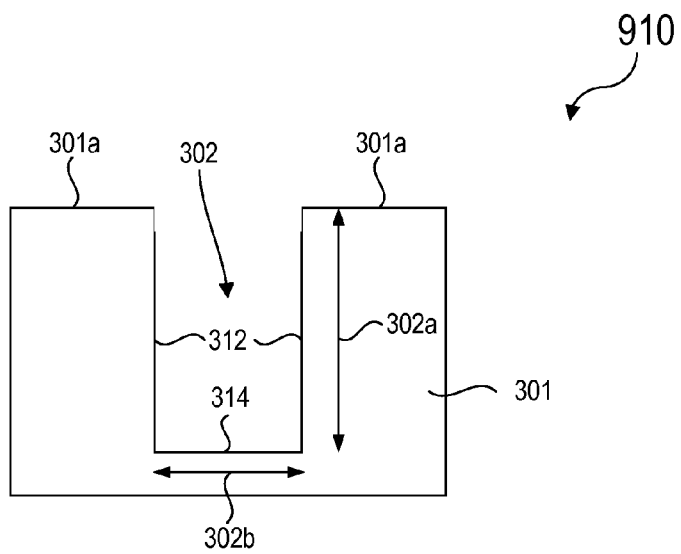
FIGS. 9A to 9E show schematic cross-sectional views of a substrate for illustrating different stages in a method of processing a substrate in accordance with an embodiment.

FIG. 9A shows in a first view 910 that a trench 302 is formed in a substrate 301. The substrate 301 includes an upper surface 301a and may further be configured in accordance with one or more embodiments described herein, for example as a semiconductor substrate, for example as a wafer, e.g. as a silicon wafer.

The trench 302 may be formed in accordance with one or more embodiments described herein, for example using a standard trench etch process. The trench 302 includes sidewalls 312 and a bottom 314. A depth of the trench 302 is indicated by double arrow 302a and may, for example, have a value in accordance with one or more embodiments described herein. Furthermore, a width of the trench 302 is indicated by double arrow 302b and may, for example, have a value in accordance with one or more embodiments described herein.

In accordance with an embodiment, a bather layer may be deposited over at least the sidewalls 312 of the trench 302 (not shown). In accordance with another embodiment, a seed layer may be deposited over the bather layer (not shown). In accordance with other embodiments, the bather layer and/or seed layer may be omitted.

Figure 9B:
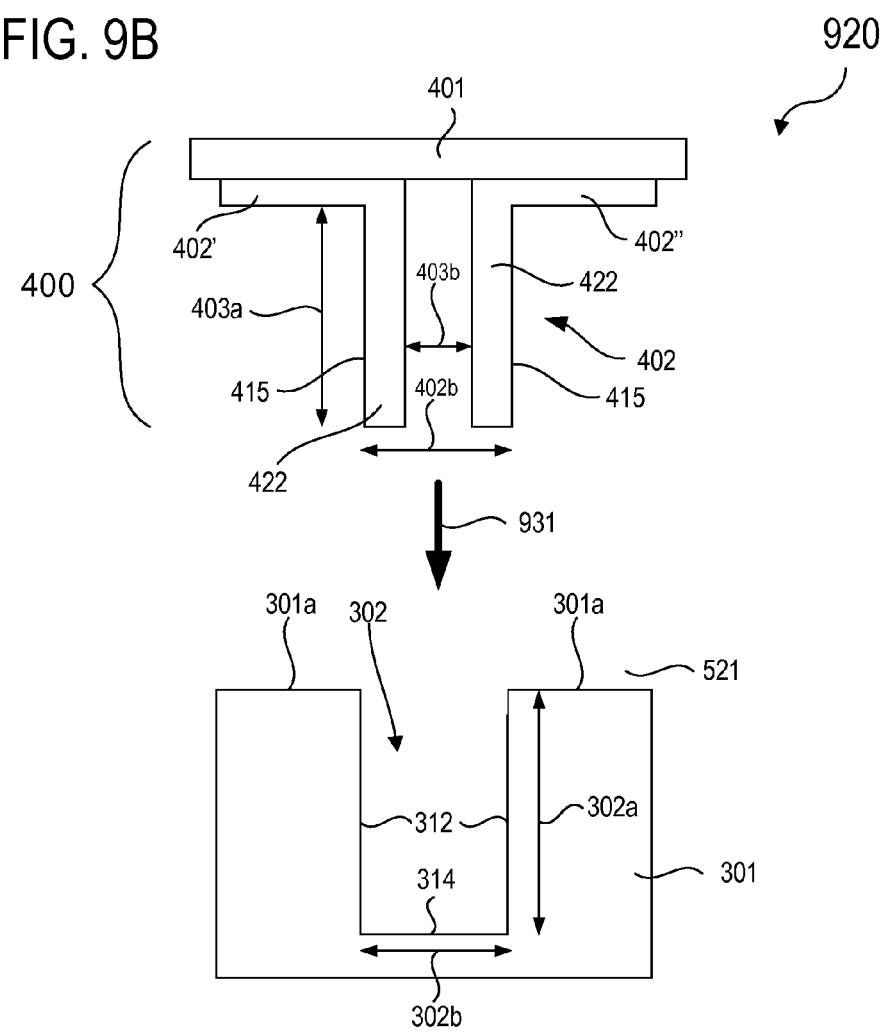
Figure 9C:
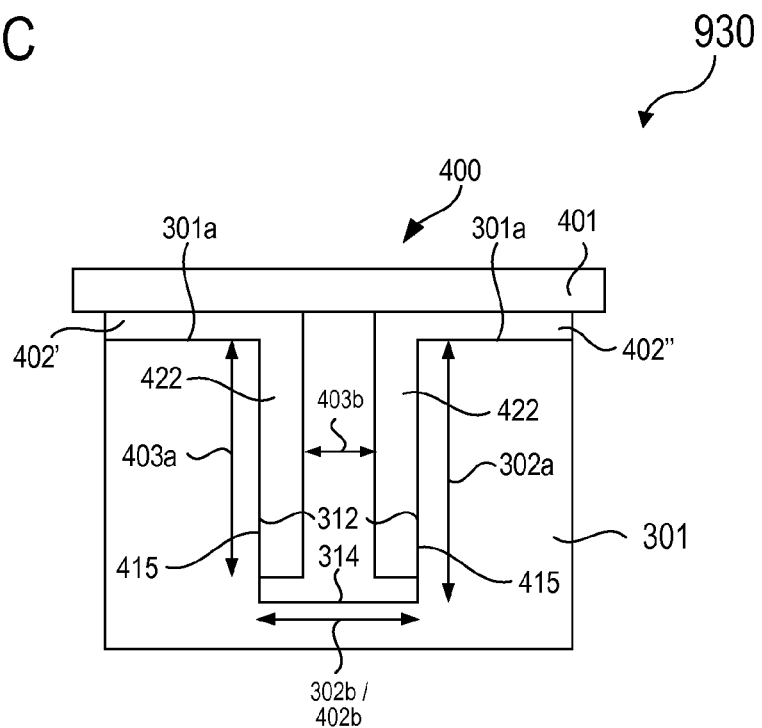

FIG. 9B and FIG. 9C show in a second view 920 and a third view 930 that a stamp 400 including a three-dimensional imprint pattern 402 is disposed in the trench 302 and over at least parts of the upper surface 301a of the substrate 301. FIG. 9B shows the stamp 400 before placement in the trench 302, the placement of the stamp 400 in the trench 302 is indicated by arrow 931. FIG. 9C shows the stamp 302 after placement in the trench 302. The stamp 400 may be configured in a similar manner as described herein above in connection with FIG. 4 and FIG. 5C. Elements with the same reference numerals as in FIG. 4 or FIG. 5C are the same and reference is made to the description above for the sake of brevity.

Figure 9D:
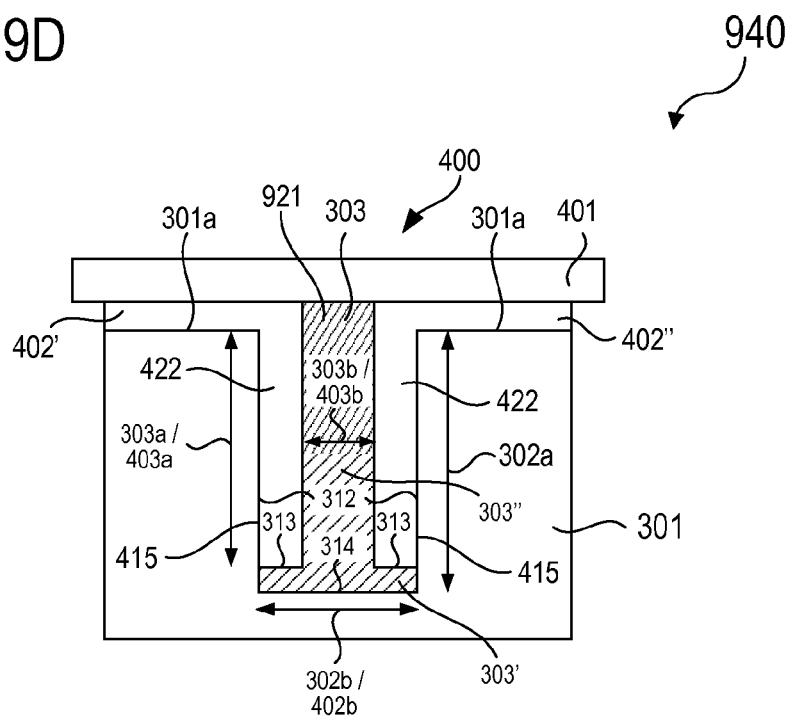

FIG. 9D shows in a fourth view 940 that parts of the trench 302 that are free from the stamp 400 are filled with trench filling material 921. In accordance with some embodiments the trench filling material 921 may be a hardenable material (for example, a polymeric resist material) and may, for example, be configured in accordance with one or more embodiments described herein. For example, in accordance with some embodiments, the trench filling material 921 may include or may be a polymeric resist, for example a photosensitive polymer resist that may be cured by exposure to light (e.g. UV radiation in case of a UV sensitive resist) in accordance with one embodiment, or a thermosensitive polymer resist that may be cured by applying elevated temperatures in accordance with another embodiment, or a resist that may be cured by applying an electrical voltage in accordance with still another embodiment.

In accordance with some embodiments, the trench filling material 921 may also cover parts of the upper surface 301a of the substrate (not shown in FIG. 9D). Illustratively, the trench filling material 921 may form a three-dimensional (3D) mask structure 303 that may have a similar shape as shown and described in connection with FIG. 3. Elements with the same reference numerals as in FIG. 3 are the same and reference is made to the description above for the sake of brevity.

In accordance with some embodiments, the three-dimensional mask structure 303 (more precisely, the trench filling material 921 of the three-dimensional mask structure 303) may be hardened after deposition of the trench filling material 921. In accordance with some embodiments, the hardening may be achieved by means of light irradiation (e.g. UV irradiation). In this case, the stamp 400 may be made of a light transparent (e.g. UV transparent) material in order to let light (e.g. UV radiation) pass, and the trench filling material 921 may be a material that may be hardened by means of light irradiation (e.g. UV irradiation) such as, for example, a photosensitive (e.g. UV sensitive) polymeric resist.

Figure 9E:
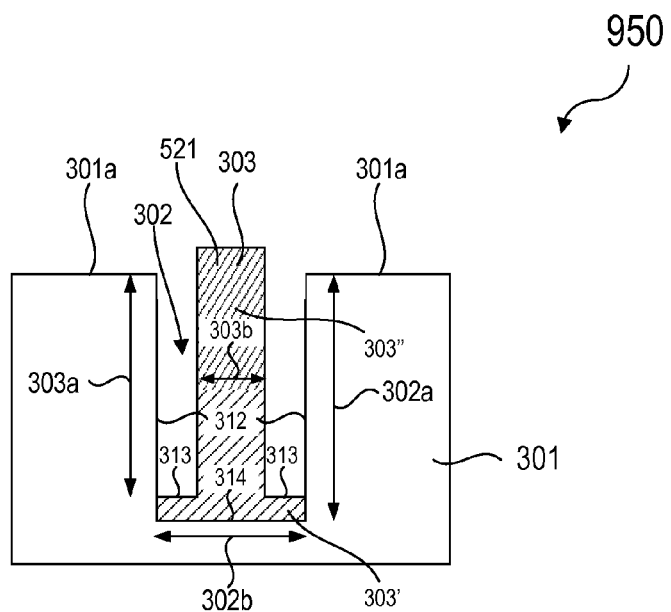

FIG. 9E shows in a fifth view 950 that the stamp 400 is removed from the trench 302. As shown, the three-dimensional mask structure 303 including the first portion 303' and the second portion 303" remains in the trench 302. It is noted that the three-dimensional mask structure 303 may further include a third portion 303''' that may cover parts of the upper surface 301a of the substrate 301, as is shown in FIG. 3, but is not shown in FIG. 9E which may clearly correspond to a cross-sectional view along the cross-sectional line A-A' in FIG. 3.

Illustratively, in accordance with some embodiments, a stamp 400 including a three-dimensional (3D) imprint pattern may be disposed in a trench 302 in the substrate 301 such that the 3D pattern may reach at least partially into the trench 302. Parts of the trench 302 that are free from the stamp 400 may subsequently be filled with trench filling material 921 (e.g. hardenable material such as, for example, a polymer resist). In accordance with some embodiments, the trench filling material 921 may be hardened after deposition of the trench filling material 921 and before removal of the stamp 400. For example, in accordance with an embodiment where the trench filling material 921 is a photosensitive resist material, the resist may be exposed to light in order to crosslink polymer chains in the resist material. In this case, the stamp 400 may be configured as a transparent stamp to let pass the light used for exposure of the resist. In accordance with other embodiments, crosslinking (or change of solubility) of resist like polymers may also be achieved by applying elevated temperatures or electrical voltages.

In accordance with an embodiment, a cleaning step such as, for example, a flash/recess step may be performed after removal of the stamp 400 to remove possible remainders of the trench filling material 921 (e.g. thin polymer films (e.g. resist films)) from e.g. the sidewalls 312 of the trench 302.

In accordance with some embodiments, the three-dimensional (3D) mask structure 303 (e.g. 3D polymer mask) may, for example, be used for subsequent metallization processes such as pattern plating processes, as described above. For example, in accordance with some embodiments, the substrate 301 may be further processed in a similar manner as described above in connection with FIG. 5F and FIG. 5G and, in accordance with some embodiments, the same or similar structures as shown in FIGS. 6 to 8 may, for example, be obtained.

In the foregoing, various embodiments with a stamp device configured as a stamp have been described. In accordance with some embodiments, a stamp device may, for example, also include or be configured as a (structured) roll. In other words, in accordance with some embodiments, a stamp device may include or may be a roll that may be structured such that it may include at least one imprint structure or pattern. The imprint structure or pattern may, for example, be configured in accordance with one or more embodiments described herein. A roll having one or more imprint structures or patterns may for example be used for rolling over the substrate (for example, over a printed circuit board (PCB)).

Figure 10:
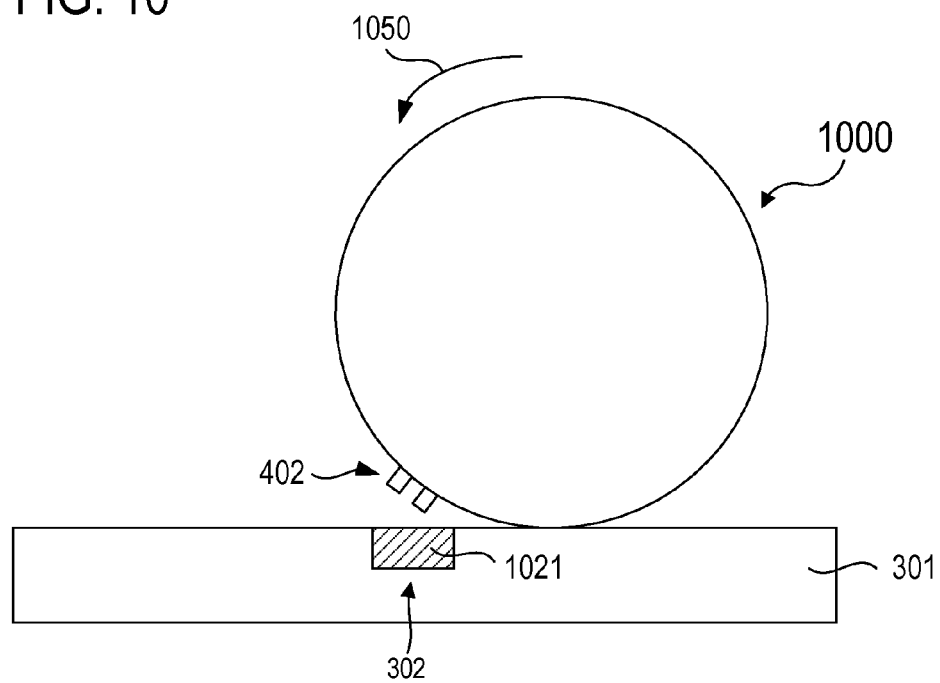
FIG. 10 shows a schematic cross-sectional view of a stamp device configured as a roll that may be used in a method of processing a substrate in accordance with some embodiments.

FIG. 10 shows a schematic cross-sectional view of a stamp device 1000, which is configured as a roll and may be used in a method of processing a substrate in accordance with an embodiment. The stamp device 1000, i.e. the roll 1000, may be structured to include an imprint pattern 402, as shown, which may be used for embossing or imprinting in a trench. The imprint pattern 402 may be configured in accordance with one or more embodiments described herein. It is to be noted that in addition to the imprint pattern 402 shown in FIG. 10 the roll 1000 may include additional imprint patterns, in accordance with some embodiments. The roll 1000 may be used for rolling over a substrate 301 (for example, over a printed circuit board (PCB) in accordance with an embodiment), as indicated by arrow 1050. The substrate 301 (e.g. PCB) may include a trench 302 (only one trench 302 is shown in FIG. 10; however, more than one trench may be present in accordance with other embodiments). The trench 302 (or trenches) may have been formed, for example, in accordance with one or more embodiments described herein. Furthermore, the trench 302 (or trenches) may have been filled with trench filling material 1021, as shown. The trench filling material 1021 may be configured in accordance with one or more embodiments described herein. When the roll 1000 rolls over the substrate 301 the imprint pattern 402 of the roll 1000 may emboss the trench filling material 1021 in the trench 302 resulting in a three-dimensional structure in the trench 302. Similarly, additional three-dimensional structures may be formed in additional trenches in the substrate 301 (not shown) when the roll 1000 continues rolling over the substrate 301.

A method of processing a substrate in accordance with an embodiment may include: forming a trench in the substrate; depositing imprint material at least into the trench; embossing the imprint material in the trench using a stamp device; and removing the stamp device from the trench.

In accordance with an embodiment, the stamp device may include or may be a stamp, for example an imprint stamp.

In accordance with another embodiment, the stamp device may include or may be a roll.

In accordance with an embodiment, the substrate may include or may be a semiconductor substrate.

In accordance with another embodiment, the substrate may include or may be a printed circuit board (PCB).

In accordance with another embodiment, the imprint material may include or may be made of a hardenable material.

In accordance with another embodiment, the imprint material may be hardened after embossing and before removal of the stamp device.

In accordance with another embodiment, the hardenable material may include or may be made of a polymerizable material.

In accordance with another embodiment, hardening the imprint material may include at least one of: exposing the imprint material to light, tempering the substrate, applying an electrical voltage to the imprint material.

In accordance with another embodiment, filling material may be deposited at least into the trench after removal of the stamp device.

In accordance with another embodiment, the filling material may include or may be metal.

In accordance with another embodiment, depositing the filling material may include a plating process. In other words, depositing the filling material may be achieved using a plating process.

In accordance with another embodiment, the stamp device may include at least one pattern suitable for embossing structures in the trench.

In accordance with another embodiment, the stamp device may include an imprint pattern corresponding to a three-dimensional mask structure to be formed at least in the trench.

In accordance with another embodiment, the stamp device may include or may be made of metal.

In accordance with another embodiment, the stamp device may include or may be made of a flexible material.

In accordance with another embodiment, the stamp device may include or may be made of a transparent material, and hardening the imprint material may include exposing the imprint material to light.

In accordance with another embodiment, at least one additional trench may be formed in the substrate, imprint material may be deposited into the at least one additional trench, the imprint material in the at least one additional trench may be embossed using the stamp device, and the stamp device may be removed from the at least one additional trench.

In accordance with another embodiment, embossing the imprint material in the at least one additional trench may be carried out after embossing the imprint material in the trench.

In accordance with another embodiment, embossing the imprint material in the at least one additional trench and embossing the imprint material in the trench may be carried out simultaneously.

In accordance with another embodiment, depositing the imprint material at least into the trench may further include depositing the imprint material over at least a part of the substrate surface, and embossing the imprint material using the stamp device may further include embossing the imprint material deposited over the substrate surface.

A method of processing a substrate in accordance with another embodiment may include: forming a trench in the substrate; disposing a stamp device at least in the trench; filling at least one part of the trench that is free from the stamp device at least partially with trench filling material; and removing the stamp device from the trench.

In accordance with an embodiment, the stamp device may include or may be a stamp, for example an imprint stamp.

In accordance with another embodiment, the stamp device may include or may be a roll.

In accordance with an embodiment, the trench filling material may include or may be a hardenable material, and the trench filling material may be hardened after filling the parts of the trench with the trench filling material and before removing the stamp device from the trench.

In accordance with another embodiment, hardening the trench filling material may include at least one of: exposing the trench filling material to light; tempering the substrate; applying an electrical voltage.

In accordance with another embodiment, filling material may be deposited at least into the trench after removal of the stamp device.

In accordance with another embodiment, the filling material may include or may be metal.

In accordance with another embodiment, depositing the filling material may include a plating process. In other words, depositing the filling material may be achieved using a plating process.

In accordance with another embodiment, the stamp device may include an imprint pattern corresponding to a three-dimensional mask structure to be formed at least in the trench.

In accordance with another embodiment, the stamp device may include or may be made of metal.

In accordance with another embodiment, the stamp device may include or may be made of a flexible material.

In accordance with another embodiment, the stamp device may include or may be made of a transparent material; and hardening the trench filling material may include exposing the trench filling material to light.

In accordance with another embodiment, at least one additional trench may be formed in the substrate; the stamp device may be disposed at least in the at least one additional trench; at least one part of the at least one additional trench that is free from the stamp device may be filled at least partially with the trench filling material; and the stamp device may be removed from the at least one additional trench.

A method of processing a substrate in accordance with another embodiment may include: forming a trench in the substrate; depositing imprint material over the substrate, thereby filling the trench at least partially with the imprint material; embossing the imprint material in the trench by means of an imprint stamp having an imprint pattern that corresponds to an inverse of a mask structure, thereby forming the mask structure at least in the trench; hardening the embossed imprint material; and removing the imprint stamp from the trench.

In accordance with an embodiment, hardening the embossed imprint material may include at least one of: exposing the imprint material to light; tempering the substrate; applying an electrical voltage to the imprint material.

In accordance with another embodiment, the imprint material may include or may be made of a photosensitive imprint resist, and hardening the embossed imprint material may include exposing the imprint material to light.

In accordance with another embodiment, the imprint material may include or may be made of imprint resist.

In accordance with another embodiment, the imprint stamp may include or may be made of a transparent material.

In accordance with another embodiment, filling material may be deposited over the substrate after removal of the imprint stamp, thereby filling at least those parts of the trench that are free from the embossed imprint material with the filling material.

In accordance with another embodiment, the filling material may include or may be made of metal.

In the following, certain features, aspects and effects of exemplary embodiments are described.

In accordance with some embodiments, imprint-like processes for three-dimensional (3D) structuring are provided.

In accordance with some embodiments, a modified imprint step may be used, where a stamp device (e.g. imprint stamp) may be also used to define structures in the third dimension (for example, inside a trench).

In accordance with some embodiments, a stamp that may be used for "macro-imprint" may be designed with patterns suitable for embossing structures in a deep trench.

In accordance with some embodiments, processes are provided that may include printing on non-planar surfaces (for example, on surfaces that may have one or more trenches (e.g. deep trenches) or recesses).

In accordance with some embodiments, processes are provided that may include "one step" structuring at two or more topography levels, thereby generating three-dimensional patterns.

In accordance with some embodiments, processes are provided that may use a stamp (or stamps) that may have a pattern (or patterns) not only for printing structures on planar surfaces (e.g. planar wafer surfaces) but also a pattern (or patterns) for embossing structures in a third dimension (e.g. inside a trench).

Effects of certain embodiments may be or may include:
3D structuring may be achieved using a lower number of process steps (e.g. compared to multi-step lithography processes) and/or
3D structuring may be achieved at lower costs (e.g. avoiding costly processes such as two-photon absorption or expensive tools).

In accordance with some embodiments, 3D target structures may be realized that may not (or only with comparatively high complexity and/or costs) be achieved using standard processes such as e.g. standard lithography processes.

For example, in accordance with some embodiments 3D mask structuring in a deep substrate trench may be achieved. In this case, standard lithography would face serious problems (resist thickness, depth of focus not sufficient, occurrence of stray light at edges, instability of the resist wall(s) due to solvent loss at bakes, limitations regarding slope of side walls, etc.) or even fail. On the other hand, two-photon lithography would also fail as the structure in the deep trench could not be accessed. Finally, standard nano-imprint processes could not be used as they are designed for printing structures on plain surfaces only.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of processing a substrate, comprising: forming a trench in the substrate;
   depositing imprint material at least into the trench, thereby contacting at least one sidewall of the trench with the imprint material;
   embossing the imprint material in the trench using a stamp device, thereby at least partially displacing the imprint material from the at least one sidewall of the trench;
   removing the stamp device from the trench;
   depositing filling material at least into the trench after removal of the stamp device, thereby at least partially contacting the filling material with the at least one sidewall of the trench; and
   removing, from the trench, the imprint material after depositing the filling material;
   wherein the filling material remains in contact with the sidewall of the trench after removal of the imprint material.

2. The method of claim 1,
   wherein the substrate comprises a semiconductor substrate.

3. The method of claim 1,
   wherein the imprint material comprises a hardenable material.

4. The method of claim 3,
   further comprising hardening the imprint material after embossing and before removal of the stamp device.

5. The method of claim 3,
   wherein the hardenable material comprises a polymerizable material.

6. The method of claim 4,
   wherein hardening the imprint material comprises at least one of:
   exposing the imprint material to light;
   tempering the substrate;
   applying an electrical voltage to the imprint material.

7. The method of claim 1,
   further comprising depositing filling material at least into the trench after removal of the stamp device.

8. The method of claim 7,
   wherein the filling material comprises metal.

9. The method of claim 7,
   wherein depositing the filling material comprises a plating process.

10. The method of claim 1,
wherein the stamp device comprises an imprint pattern corresponding to a three-dimensional mask structure to be formed at least in the trench.

11. The method of claim 1,
wherein the stamp device comprises a metal.

12. The method of claim 1,
wherein the stamp device comprises a flexible material.

13. The method of claim 6,
wherein the stamp device comprises a transparent material; and
wherein hardening the imprint material comprises exposing the imprint material to light.

14. The method of claim 1, further comprising:
forming at least one additional trench in the substrate; depositing imprint material into the at least one additional trench; embossing the imprint material in the at least one additional trench using the stamp device;
removing the stamp device from the at least one additional trench.

15. The method of claim 14,
wherein embossing the imprint material in the at least one additional trench is carried out after embossing the imprint material in the trench.

16. The method of claim 14,
wherein embossing the imprint material in the at least one additional trench and embossing the imprint material in the trench are carried out simultaneously.

17. The method of claim 1,
wherein depositing the imprint material at least into the trench further comprises depositing the imprint material over at least a part of the substrate surface; and
wherein embossing the imprint material using the stamp device further comprises embossing the imprint material deposited over the substrate surface.

18. The method of claim 1,
wherein the stamp device comprises an imprint stamp.

19. The method of claim 1,
wherein the stamp device comprises a roll.

20. The method of claim 1,
wherein the substrate comprises a printed circuit board.

21. A method of processing a substrate, comprising:
forming a trench in the substrate;
depositing imprint material over the substrate, thereby filling the trench at least partially with the imprint material and at least partially contacting at least one sidewall of the trench with the imprint material;
embossing the imprint material in the trench by means of an imprint stamp having an imprint pattern that corresponds to an inverse of a mask structure, thereby forming the mask structure at least in the trench and at least partially displacing the imprint material from the at least one sidewall of the trench;
hardening the embossed imprint material;
removing the imprint stamp from the trench;
depositing filling material over the substrate after removal of the imprint stamp device, thereby at least partially contacting the filling material with the at least one sidewall of the trench; and removing, from the trench, the imprint material after depositing the filling material over the substrate;
wherein the filling material remains in contact with the sidewall of the trench after removal of the imprint material.

22. The method of claim 21,
wherein hardening the embossed imprint material comprises at least one of:
exposing the imprint material to light;
tempering the substrate;
applying an electrical voltage to the imprint material.

23. The method of claim 21,
wherein the imprint material comprises imprint resist.

24. The method of claim 21,
wherein depositing the filling material over the substrate after removal of the imprint stamp comprises filling at least parts of the trench that are free from the embossed imprint material with the filling material.

25. The method of claim 21,
wherein the filling material comprises metal.

\* \* \* \* \*